US012748349B2

(12) United States Patent
Hong et al.

(10) Patent No.: US 12,748,349 B2
(45) Date of Patent: Sep. 29, 2026

(54) PHOTOSENSITIVE RESIN COMPOSITION AND DISPLAY DEVICE INCLUDING THE SAME

(71) Applicant: Samsung Display Co., LTD., Yongin-si (KR)

(72) Inventors: Sung Hwan Hong, Yongin-si (KR); Suk Hoon Kang, Yongin-si (KR); Jeong Soo Kim, Yongin-si (KR); Beom Soo Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 938 days.

(21) Appl. No.: 17/992,090

(22) Filed: Nov. 22, 2022

(65) Prior Publication Data

US 2023/0324795 A1 Oct. 12, 2023

(30) Foreign Application Priority Data

Apr. 8, 2022 (KR) ........................ 10-2022-0043800

(51) Int. Cl.

| | |
|---|---|
| ***C08F 2/46*** | (2006.01) |
| ***C08F 2/50*** | (2006.01) |
| ***C08G 61/04*** | (2006.01) |
| ***G03F 7/00*** | (2006.01) |
| ***G03F 7/004*** | (2006.01) |
| ***G03F 7/028*** | (2006.01) |
| ***G03F 7/032*** | (2006.01) |
| ***H10H 20/851*** | (2025.01) |
| *H10W 90/00* | (2026.01) |

(52) U.S. Cl.

CPC ............ *G03F 7/032* (2013.01); *G03F 7/0007* (2013.01); *G03F 7/0045* (2013.01); *G03F 7/0048* (2013.01); *G03F 7/028* (2013.01); *H10H 20/8512* (2025.01); *H10W 90/00* (2026.01)

(58) Field of Classification Search

CPC ........ G03F 7/032; G03F 7/007; G03F 7/0045; G03F 7/0048; G03F 7/028; H01L 25/0753; H01L 25/167; H10H 20/8512; H10H 20/819; H10H 20/854; H10H 20/855; H10H 20/882

USPC ....... 522/103, 100, 189, 184, 6, 71, 1; 520/1

See application file for complete search history.

(56) References Cited

U.S. PATENT DOCUMENTS

| | | | | |
|---|---|---|---|---|
| 11,037,914 | B2 | 6/2021 | Kim | |
| 11,774,852 | B2 | 10/2023 | Bae et al. | |
| 11,791,323 | B2 | 10/2023 | Kim | |
| 2009/0054543 | A1* | 2/2009 | Nozawa | G03F 7/027 560/104 |
| 2023/0275197 | A1 | 8/2023 | Kim et al. | |

FOREIGN PATENT DOCUMENTS

| | | | | |
|---|---|---|---|---|
| JP | 2010-145458 A | | 7/2010 | |
| JP | 2011-145504 A | | 7/2011 | |
| JP | 2018156068 A | * | 10/2018 | G03F 7/004 |
| KR | 10-2004-0030848 | | 4/2004 | |
| KR | 10-2010-0077798 | | 7/2010 | |
| KR | 10-1208893 B1 | | 12/2012 | |
| KR | 10-1559692 | | 10/2015 | |
| KR | 10-2018-0131378 | | 12/2018 | |
| KR | 1020190111637 | * | 10/2019 | |
| KR | 10-2020-0005692 A | | 1/2020 | |
| KR | 10-2020-0115465 | | 10/2020 | |
| KR | 10-2021-0066622 A | | 6/2021 | |
| KR | 10-2021-0098654 | | 8/2021 | |
| KR | 10-2022-0014470 A | | 2/2022 | |

OTHER PUBLICATIONS

Lee et al, JP 2018156068 Machine Translation, Oct. 4, 2018 (Year: 2018).*

Cho et al, KR 1020190111637 Machine Translation, Oct. 2, 2019 (Year: 2019).*

Korean Notice of Allowance issued in corresponding KR Application No. 10-2022-0043800, dated Sep. 25, 2025, 2 pages.

* cited by examiner

*Primary Examiner* — Jessica Whiteley

(74) *Attorney, Agent, or Firm* — Womble Bond Dickinson (US) LLP

(57) ABSTRACT

A photosensitive resin composition and a display device including the same are provided. The photosensitive resin composition includes a binder, a photopolymerizable monomer, a photopolymerization initiator, an ultraviolet absorber, and a solvent, wherein a content ratio of the ultraviolet absorber is in a range of about 40% to about 60% with respect to the photopolymerization initiator, and the binder includes a first repeating unit represented by Chemical Formula 1, a second repeating unit represented by Chemical Formula 2, a third repeating unit including one or more repeating units each independently represented by one of Chemical Formula 3 to Chemical Formula 5, a fourth repeating unit including one or more repeating units each independently represented by one of Chemical Formula 4 and Chemical Formula 6, and a fifth repeating unit including one or more repeating units each independently represented by one of Chemical Formula 3 to Chemical Formula 8.

20 Claims, 9 Drawing Sheets

| INSTRUMENT | SUBSTRATE SAMPLE #3 | SUBSTRATE SAMPLE #4 | SUBSTRATE SAMPLE #5 | SUBSTRATE SAMPLE #6 | SUBSTRATE SAMPLE #7 |
| --- | --- | --- | --- | --- | --- |
| SEM #1 |  |  |  |  |  |
| SEM #2 |  |  |  |  |  |
| FIB |  |  |  |  |  |

PHOTOSENSITIVE RESIN COMPOSITION AND DISPLAY DEVICE INCLUDING THE SAME

CROSS-REFERENCE TO RELATED APPLICATION(S)

This application claims priority to and benefits of Korean Patent Application No. 10-2022-0043800 under 35 U.S.C. § 119, filed on Apr. 8, 2022, in the Korean Intellectual Property Office, the entire contents of which are incorporated herein by reference.

BACKGROUND

1. Technical Field

The disclosure relates to a photosensitive resin composition and a display device including the same.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provide a photosensitive resin composition capable of preventing a reduction in spreadability of ink and a display device including the photosensitive resin composition.

However, the disclosure is not restricted to the embodiments set forth herein. The above and other aspects of the disclosure will become more apparent to one of ordinary skill in the art to which the disclosure pertains by referencing the detailed description given below.

According to an embodiment, a photosensitive resin composition may include a binder, a photopolymerizable monomer, a photopolymerization initiator, an ultraviolet absorber, and a solvent, wherein a content ratio of the ultraviolet absorber may be in a range of about 40% to about 60% with respect to a content of the photopolymerization initiator, and the binder may include a first repeating unit represented by Chemical Formula 1, a second repeating unit represented by Chemical Formula 2, a third repeating unit including one or more repeating units each independently represented by one of Chemical Formula 3 to Chemical Formula 5, a fourth repeating unit including one or more repeating units each independently represented by one of Chemical Formula 4 and Chemical Formula 6, and a fifth repeating unit including one or more repeating units each independently represented by one of Chemical Formula 3 to Chemical Formula 8:

[Chemical Formula 1]

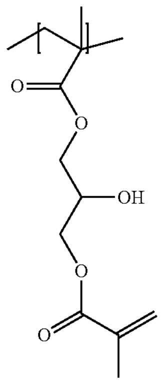

[Chemical Formula 2]

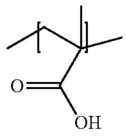

[Chemical Formula 3]

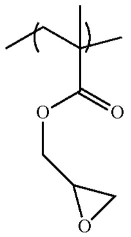

[Chemical Formula 4]

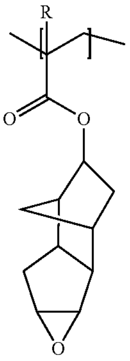

[Chemical Formula 5]

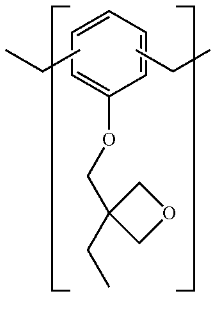

-continued

[Chemical Formula 6]

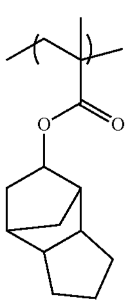

[Chemical Formula 7]

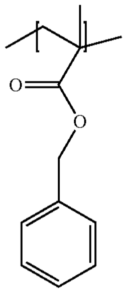

[Chemical Formula 8]

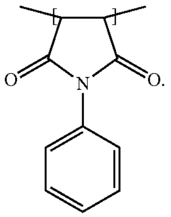

In Chemical Formula 4, R may be a substituted or unsubstituted $C_1$-$C_{10}$ alkyl group.

In an embodiment, the ultraviolet absorber may include a triazine-based compound, a benzotriazole-based compound, a benzophenon-based compound, an oxalanilide-based compound, or any combination thereof.

In an embodiment, a content of the ultraviolet absorber may be in a range of about 0.1 to about 10 parts by weight based on 100 parts by weight of a total solid content of the photosensitive resin composition.

In an embodiment, the photosensitive resin composition may further include scattering particles, wherein a content of the scattering particles may be in a range of about 1 to about 30 parts by weight based on 100 parts by weight of a total solid content of the photosensitive resin composition In an embodiment, a particle diameter of the scattering particles may be in a range of about 100 to about 300 nm.

In an embodiment, a content ratio of the first repeating unit to the third repeating unit may be in a range of about 2:1 to about 3:1.

In an embodiment, a content ratio of the fifth repeating unit to the third repeating unit may be in a range of about 1:1 to about 2:1.

In an embodiment, based on a total binder content, a content ratio of the first repeating unit may be in a range of about 30% to 40%, a content ratio of the second repeating unit may be in a range of 20% to 30%, a content ratio of the third repeating unit may be in a range of about 10% to 20%, a content ratio of the fourth repeating unit may be in a range of about 5% to 15%, and a content ratio of the fifth repeating unit may be in a range of about 10% to 20%.

In an embodiment, the photopolymerizable monomer may include ethylene glycol dimethacrylate, diethylene glycol dimethacrylate, triethylene glycol dimethacrylate, propylene glycol dimethacrylate, neopentyl glycol dimethacrylate, 1,4-butanediol dimethacrylate, 1,6-hexanediol dimethacrylate, bisphenol A dimethacrylate, pentaerythritol dimethacrylate, pentaerythritol trimethacrylate, pentaerythritol tetramethacrylate, pentaerythritol hexamethacrylate, dipentaerythritol dimethacrylate, dipentaerythritol trimethacrylate, dipentaerythritol pentamethacrylate, dipentaerythritol hexamethacrylate, bisphenol A epoxy methacrylate, ethylene glycol monomethylether methacrylate, trimethylol propane trimethacrylate, trismethacryloyloxyethyl phosphate, novolac epoxy methacrylate, or any combination thereof.

In an embodiment, the photopolymerization initiator may include an oxime-based compound, an acetophenone-based compound, a thioxanthone-based compound, a benzophenone-based compound, or any combination thereof.

In an embodiment, a content of a photopolymerization initiator may be in a range of about 1 to about 5 parts by weight based on 100 parts by weight of a total solid content of the photosensitive resin composition.

In an embodiment, the solvent may include ethylene glycol monoethyl ether, ethyl cellosolve acetate, 2-hydroxyethyl propionate, diethylene glycol monomethyl, propylene glycol monomethyl ether acetate, propylene glycol propyl ether acetate, or any combination thereof.

In an embodiment, a content of the solvent may be in a range of about 70 to about 80 parts by weight based on 100 parts by weight of the photosensitive resin composition.

According to embodiments, a display device may include a plurality of light emitting elements disposed on a substrate, an insulating layer disposed on the light emitting elements, and an upper bank layer disposed on the insulating layer and may further include an opening exposing the insulating layer. The upper bank layer may include a binder, a photopolymerizable monomer, a photopolymerization initiator, and an ultraviolet absorber. A content ratio of the ultraviolet absorber may be in a range of about 40% to about 60% with respect to a content of the photopolymerization initiator. The binder may include a first repeating unit represented by Chemical Formula 1, a second repeating unit represented by Chemical Formula 2, a third repeating unit including one or more repeating units each independently represented by one of Chemical Formula 3 to Chemical Formula 5, a fourth repeating unit including one or more repeating units each independently represented by one of Chemical Formula 4 and Chemical Formula 6, and a fifth repeating unit including one or more repeating units each independently represented by one of Chemical Formula 3 to Chemical Formula 8:

[Chemical Formula 1]

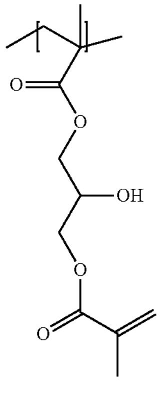

-continued

[Chemical Formula 2]

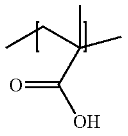

[Chemical Formula 3]

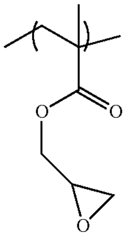

[Chemical Formula 4]

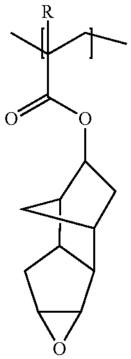

[Chemical Formula 5]

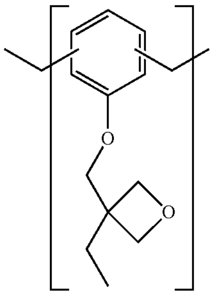

[Chemical Formula 6]

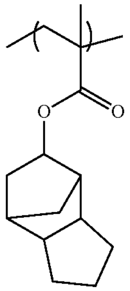

[Chemical Formula 7]

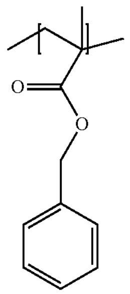

-continued

[Chemical Formula 8]

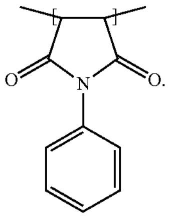

In Chemical Formula 4, R may be a substituted or unsubstituted $C_1$-$C_{10}$ alkyl group.

In an embodiment, the upper bank layer may further include scattering particles, and a particle diameter of the scattering particles may be in a range of about 100 to about 300 nm.

In an embodiment, the display device may further include a color control layer disposed on the insulating layer and disposed in the opening, wherein the color control layer may contact a surface of the insulating layer.

In an embodiment, the display device may further include at least one capping layer disposed on the color control layer and covering the color control layer and the upper bank layer.

In an embodiment, the display device may further include a color filter layer disposed on the at least one capping layer.

In an embodiment, the display device may further include a first electrode and a second electrode disposed under the light emitting elements and spaced apart from each other, a first connection electrode electrically connected to an end of each light emitting element, and a second connection electrode electrically connected to another end of each light emitting element.

In an embodiment, each of the light emitting elements may include a first semiconductor layer, a second semiconductor layer, and a light emitting layer disposed between the first semiconductor layer and the second semiconductor layer.

According to embodiments, a photosensitive composition and a display device may include the same, even if outgassing during post-baking of the photosensitive resin composition causes uncured residues to be ejected onto a surface of an insulating layer to which ink may be applied, the surface of the insulating layer may be hydrophilic, thus preventing a reduction in the spreadability of the ink.

According to embodiments, a photosensitive composition and a display device may include the same, it may be possible to prevent the formation of a residual film of an upper bank layer pattern and secure pattern stability.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
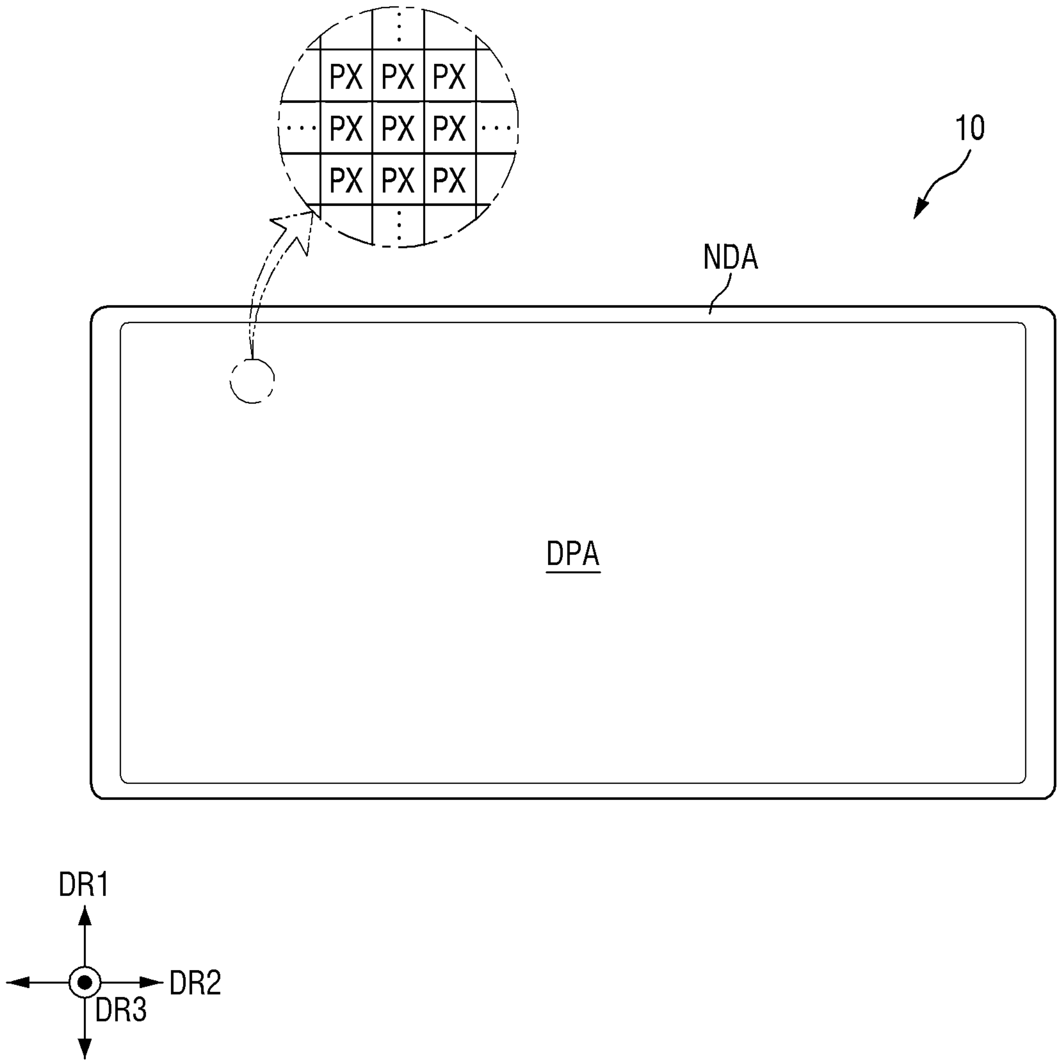
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may include a physical or electrical connection or coupling.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Each of the features of the various embodiments of the disclosure may be combined or combined with each other, in part or in whole, and technically various interlocking and driving may be possible. Each embodiment may be implemented independently of each other or may be implemented together in an association.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include a television, a notebook computer, a monitor, a billboard, an Internet of things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game console, a digital camera and a camcorder, all of which provide a display screen.

The display device 10 includes a display panel that provides a display screen. Examples of the display panel include an inorganic light emitting diode display panel, an organic light emitting display panel, a quantum dot light emitting display panel, a plasma display panel, and a field emission display panel. A case where an inorganic light emitting diode display panel may be applied as an example of the display panel will be described below, but the disclosure is not limited to this case, and other display panels can also be applied as long as the same technical spirit is applicable.

The shape of the display device 10 may be variously modified. For example, the display device 10 may have various shapes such as a horizontally long rectangle, a vertically long rectangle, a square, a quadrilateral with rounded corners (vertices), other polygons, or a circle. The shape of a display area DPA of the display device 10 may also be similar to the overall shape of the display device 10. In FIG. 1, the display device 10 shaped like a rectangle that is long in a second direction DR2 is illustrated.

The display device 10 may include the display area DPA and a non-display area NDA, The display area DPA may be an area where a screen may be displayed, and the non-display area NDA may be an area where no screen may be displayed. The display area DPA may also be referred to as an active area, and the non-display area NBA may also be referred to as an inactive area. The display area DPA may generally occupy a center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic planar shape having each side inclined with respect to a direction. The pixels PX may be arranged in a stripe or island type. Each of the pixels PX may include one or more light emitting elements which emit light of a specific wavelength band to display a specific color.

The non-display area NDA may be located around the display area DPA. The non-display area NBA may entirely or partially surround the display area. DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be located, or external devices may be mounted.

Figure 2:
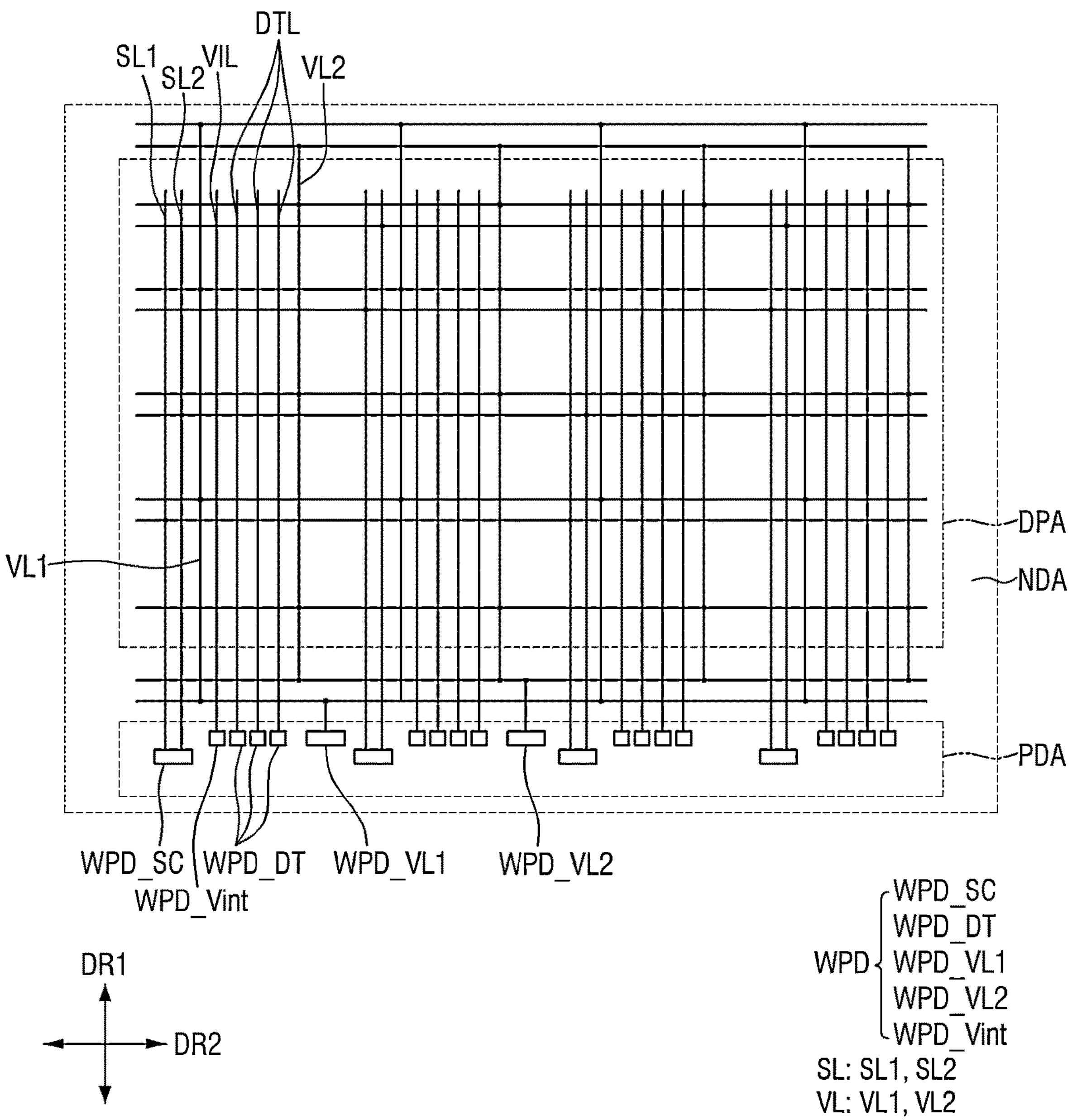
FIG. 2 is a schematic layout view illustrating wirings included in the display device according to an embodiment.

FIG. 2 is a schematic layout view illustrating wirings included in the display device 10 according to an embodiment.

Referring to FIG. 2, the display device 10 may include wirings. The wirings may include scan lines SL (SL1 and SL2), data lines DTL, initialization voltage wirings VIL, and voltage wirings VL (VL1 and VL2). Although not illustrated in the drawing, other wirings may be further disposed in the display device 10.

The scan lines SL may extend in a first direction DR1. The scan lines SL may include a first scan line SL1 and a second scan line SL2 spaced apart from each other and forming each pair. The scan line SL may be connected to each scan wiring pad WPD_SC connected to a scan driver (not illustrated). The scan lines SL may extend from a pad area PDA disposed in the non-display area NDA to the display area DPA.

The data lines DTL may extend in the first direction DR1. Three data lines DTL form each pair and may be disposed adjacent to each other. The data lines DTL may extend from the pad area PDA disposed in the non-display area NDA to the display area DPA.

The initialization voltage wirings VIL may also extend in the first direction DR1. Each of the initialization voltage wirings VIL may be disposed between the data lines DTL and a scan line SL. The initialization voltage wirings VIL may extend from the pad area PDA disposed in the non-display area NDA to the display area DPA.

A first voltage wiring VL1 and a second voltage wiring VL2 may include portions extending in the first direction DR1 and portions extending in the second direction DR2. Of the first voltage wiring VL1 and the second voltage wiring VL2, the portions extending in the first direction DR1 may be disposed across the display area DPA, and some of the portions extending in the second direction DR2 may be disposed in the display area DPA, and the other portions may be disposed in the non-display area NDA located on both sides of the display area DPA in the first direction DR1. The first voltage wiring VL1 and the second voltage wiring VL2 may have a mesh structure in the entire display area DPA.

The scan lines SL, the data lines DTL, the initialization voltage wirings VIL, the first voltage wiring VL1, and the second voltage wiring VL2 may be electrically connected to at least one wiring pad WPD. Each wiring pad WPD may be disposed in the non-display area NDA. Each wiring pad WPD may be disposed in the pad area PDA located on a lower side of the display area DPA which may be a second side in the first direction DR1, but the position of the pad area PDA may be variously changed according to the size and specification of the display device 10. The scan lines SL may be connected to a scan wiring pad WPD_SC disposed in the pad area PDA, and the data lines DTL may be connected to different data wiring pads WPD_DT, respectively. Each of the initialization voltage wirings VIL may be connected to an initialization wiring pad WPD_Vint, the first voltage wiring VL1 may be connected to a first voltage wiring pad WPD_VL1, and the second voltage wiring VL2 may be connected to a second voltage wiring pad WPD_VL2. An external device may be mounted on the wiring pads WPD. The external device may be mounted on the wiring pads WPD through an anisotropic conductive film, ultrasonic bonding, or the like. Although each wiring pad WPD is disposed in the pad area PDA located on the lower side of the display area DPA in the drawing, the disclosure is not limited thereto. Some of the wiring pads WPD may also be disposed in an area located on an upper side or any one of left and right sides of the display area DPA.

Each pixel PX or subpixel SPXn (where n is an integer of 1 to 3) of the display device 10 includes a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit may be variously changed. According to an embodiment, each subpixel SPXn of the display device 10 may have a 3T1C structure in which the pixel driving circuit includes three transistors and one capacitor. Although the pixel driving circuit will be described below using the 3T1C structure as an example, the disclosure is not limited thereto, and other various modified pixel structures such as a 2T1C structure, a 7T1C structure, and a 6T1C structure may also be applicable.

Figure 3:
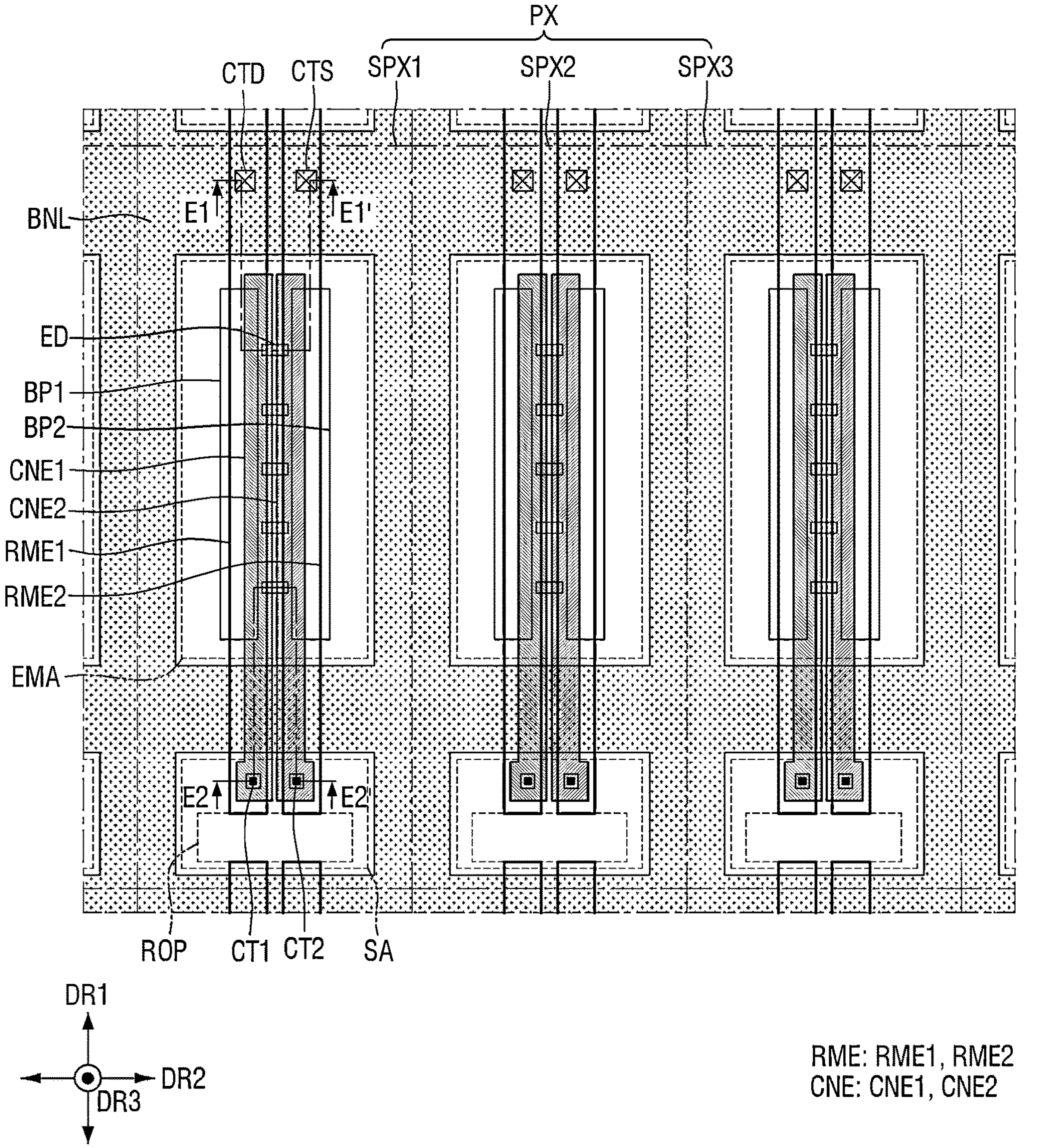
FIG. 3 is a schematic plan view of a pixel of the display device according to an embodiment.

FIG. 3 is a schematic plan view of a pixel PX of the display device 10 according to an embodiment. FIG. 3 illustrates the planar arrangement of electrodes RME (RME1 and RME2), bank patterns BP1 and BP2, a bank layer BNL, light emitting elements ED, and connection electrodes CNE (CNE1 and CNE2) in a pixel PX of the display device 10.

Referring to FIG. 3, each of the pixels PX of the display device 10 may include subpixels SPXn. For example, one pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be red, the second color may be green, and the third color may be blue. However, the disclosure is not limited thereto, and the subpixels SPXn may also emit light of the same color. In an embodiment, the subpixels SPXn may emit blue light. Although one pixel PX includes three subpixels SPXn in the drawing, the disclosure is not limited thereto, and the pixel PX may also include a greater number of subpixels SPXn.

Each subpixel SPXn of the display device 10 may include an emission area EMA and a non-emission area. The emission area EMA may be an area in which the light emitting elements ED may be disposed to emit light of a specific wavelength band. The non-emission area may be an area in which the light emitting elements ED may not be disposed and from which no light may be output because light emitted from the light emitting elements ED does not reach this area.

The emission area EMA may include an area in which the light emitting elements ED may be disposed and an area which may be adjacent to the light emitting elements ED and from which light emitted from the light emitting elements ED may be output. For example, the emission area EMA may also include an area from which light emitted from the light emitting elements ED may be output after being reflected or refracted by other members. Light emitting elements ED may be disposed in each subpixel SPXn, and an area where the light emitting elements ED may be located and an area adjacent to this area may form the emission area EMA.

Although the respective emission areas EMA of the subpixels SPXn have substantially the same area in the drawing, the disclosure is not limited thereto. In embodiments, the emission area EMA of each subpixel SPXn may have a different area according to the color or wavelength band of light emitted from the light emitting elements ED disposed in the subpixel SPXn.

Each subpixel SPXn may further include a sub-area SA disposed in the non-emission area. The sub-area SA of each subpixel SPXn may be disposed on a lower side of the emission area EMA which may be the second side in the first direction DR1. The emission area EMA and the sub-area SA may be alternately arranged along the first direction DR1, and the sub-area SA may be disposed between the emission areas EMA of different subpixels SPXn spaced apart from each other in the first direction DR1. For example, the emission area EMA and the sub-area SA may be alternately arranged in the first direction DR1 and may each be repeatedly arranged in the second direction DR2. However, the disclosure is not limited thereto, and the arrangement of the emission areas EMA and the sub-areas SA in pixels PX may also be different from that in FIG. 3.

Light may not exit from the sub-area SA because the light emitting elements ED may not be disposed in the sub-area SA, but a portion of each of the electrodes RME disposed in each subpixel SPXn may be disposed in the sub-area SA. The electrodes RME disposed in different subpixels SPXn may be separated from each other by a separation portion ROP of the sub-area SA.

The display device 10 may include the electrodes RME (RME1 and RME2), the bank patterns BP1 and BP2, the bank layer BNL, the light emitting elements ED, and the connection electrodes CNE (CNE1 and CNE2).

The bank patterns BP1 and BP2 may be disposed in the emission area EMA of each subpixel SPXn. The bank patterns BP1 and BP2 may have a width in the second direction DR2 and may extend in the first direction DR1.

For example, the bank patterns BP1 and BP2 may include a first bank pattern BP1 and a second bank pattern BP2 spaced apart from each other in the second direction DR2 in the emission area EMA of each subpixel SPXn. The first bank pattern BP1 may be disposed on a left side of a center of the emission area EMA which may be a first side in the second direction DR2, and the second bank pattern BP2 may be spaced apart from the first bank pattern BP1 and disposed on a right side of the center of the emission area EMA which may be a second side in the second direction DR2. The first bank pattern BP1 and the second bank pattern BP2 may be alternately arranged along the second direction DR2 and may be disposed as island-shaped patterns in the display area DPA. Light emitting elements ED may be disposed between the first bank pattern BP1 and the second bank pattern BP2.

The first bank pattern BP1 and the second bank pattern BP2 may have the same length in the first direction DR1 but may be shorter in the first direction DR1 than the emission area EMA surrounded by the bank layer BNL. The first bank pattern BP1 and the second bank pattern BP2 may be spaced apart from portions of the bank layer BNL which extend in the second direction DR2. However, the disclosure is not limited thereto, and the bank patterns BP1 and BP2 may also be integrated with the bank layer BNL or may partially overlap the portions of the bank layer BNL which extend in the second direction DR2. The length of each of the bank patterns BP1 and BP2 in the first direction DR1 may be equal to or greater than the length, in the first direction DR1, of the emission area EMA surrounded by the bank layer BNL.

The first bank pattern BP1 and the second bank pattern BP2 may have the same width in the second direction DR2. However, the disclosure is not limited thereto, and they may also have different widths. For example, any one bank pattern may have a greater width than the other bank pattern, and the wider bank pattern may be disposed over the emission areas EMA of different subpixels SPXn adjacent in the second direction DR2. The bank patterns BP1, BP2 disposed over the emission areas EMA and a portion of the bank layer BNL extending in the first direction DR1 may overlap each other in a thickness direction. Although two bank patterns BP1 and BP2 having the same width may be disposed in each subpixel SPXn in the drawing, the disclosure is not limited thereto. The number and shape of the bank patterns BP1 and BP2 may vary according to the number or arrangement structure of the electrodes RME.

The electrodes RME (RME1 and RME2) extend in one direction and may be disposed in each subpixel SPXn. The electrodes RME1 and RME2 may extend in the first direction DR1 to lie in the emission area EMA and the sub-area SA of each subpixel SPXn and may be spaced apart from each other in the second direction DR2. The electrodes RME may be electrically connected to the light emitting elements ED to be described later. However, the disclosure is not limited thereto, and the electrodes RME may also not be electrically connected to the light emitting elements ED.

The display device 10 may include a first electrode RME1 and a second electrode RME2 disposed in each subpixel SPXn. The first electrode RME1 may be disposed on the left side of the center of the emission area EMA, and the second electrode RME2 may be spaced apart from the first electrode RME1 in the second direction DR2 and disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may extend beyond the bank layer BNL to lie in a corresponding subpixel SPXn and a portion of the sub-area SA. The first electrodes RME1 and the second electrodes RME2 of different subpixels SPXn may be spaced apart from each other by the separation portion ROP located in the sub-area SA of any one subpixel SPXn.

Although two electrodes RME extend in the first direction DR1 in each subpixel SPXn in the drawing, the disclosure is not limited thereto. For example, in the display device 10, a greater number of the electrodes RME may be disposed in one subpixel SPXn, or the electrodes RME may be partially bent and may have a different width according to position.

The bank layer BNL may surround the subpixels SPXn, the emission areas EMA, and the sub-areas SA. The bank layer BNL may be disposed at boundaries between the subpixels SPXn adjacent to each other in the first direction DR1 and the second direction DR2 and may also be disposed at boundaries between the emission areas EMA and the sub-areas SA. The subpixels SPXn, the emission areas EMA and the sub-areas SA of the display device 10 may be areas separated by the bank layer BNL. Distances between the subpixels SPXn, the emission areas EMA, and the sub-areas SA may vary according to a width of the bank layer BNL.

The bank layer BNL may include portions extending in the first direction DR1 and the second direction DR2 in plan view to form a grid pattern in the entire display area DPA. The bank layer BNL may be disposed at the boundary of each subpixel SPXn to separate neighboring subpixels SPXn. The bank layer BNL may surround the emission area EMA and the sub-area SA disposed in each subpixel SPXn to separate them from each other.

The light emitting elements ED may be disposed in the emission area EMA. The light emitting elements ED may be disposed between the bank patterns BP1 and BP2 and may be spaced apart from each other in the first direction DR1. In an embodiment, the light emitting elements ED may extend in a direction, and both ends of the light emitting elements ED may be disposed on different electrodes RME, respectively. A length of each light emitting element ED may be greater than a distance between the electrodes RME spaced apart in the second direction DR2. The direction in which the light emitting elements ED extend may be substantially perpendicular to the first direction DR1 in which the electrodes RME extend. However, the disclosure is not limited thereto, and the direction in which the light emitting elements ED extend may also be the second direction DR2 or a direction oblique to the second direction DR2.

The connection electrodes CNE (CNE1 and CNE2) may be disposed on the electrodes RME and the bank patterns BP1 and BP2. The connection electrodes CNE may extend in a direction and may be spaced apart from each other. Each of the connection electrodes CNE may contact the light emitting elements ED and may be electrically connected to an electrode RME or a conductive layer under the electrode RME.

The connection electrodes CNE may include a first connection electrode CNE1 and a second connection electrode CNE2 disposed in each subpixel SPXn. The first connection electrode CNE1 may extend in the first direction DR1 and may be disposed on the first electrode RME1 or the first bank pattern BP1. The first connection electrode CNE1 may partially overlap the first electrode RME1 and may extend from the emission area EMA to the sub-area SA beyond the bank layer BNL. The second connection electrode CNE2 may extend in the first direction DR1 and may be disposed on the second electrode RME2 or the second bank pattern BP2. The second connection electrode CNE2 may partially overlap the second electrode RME2 and may extend from the emission area EMA to the sub-area SA beyond the bank layer BNL.

Figure 4:
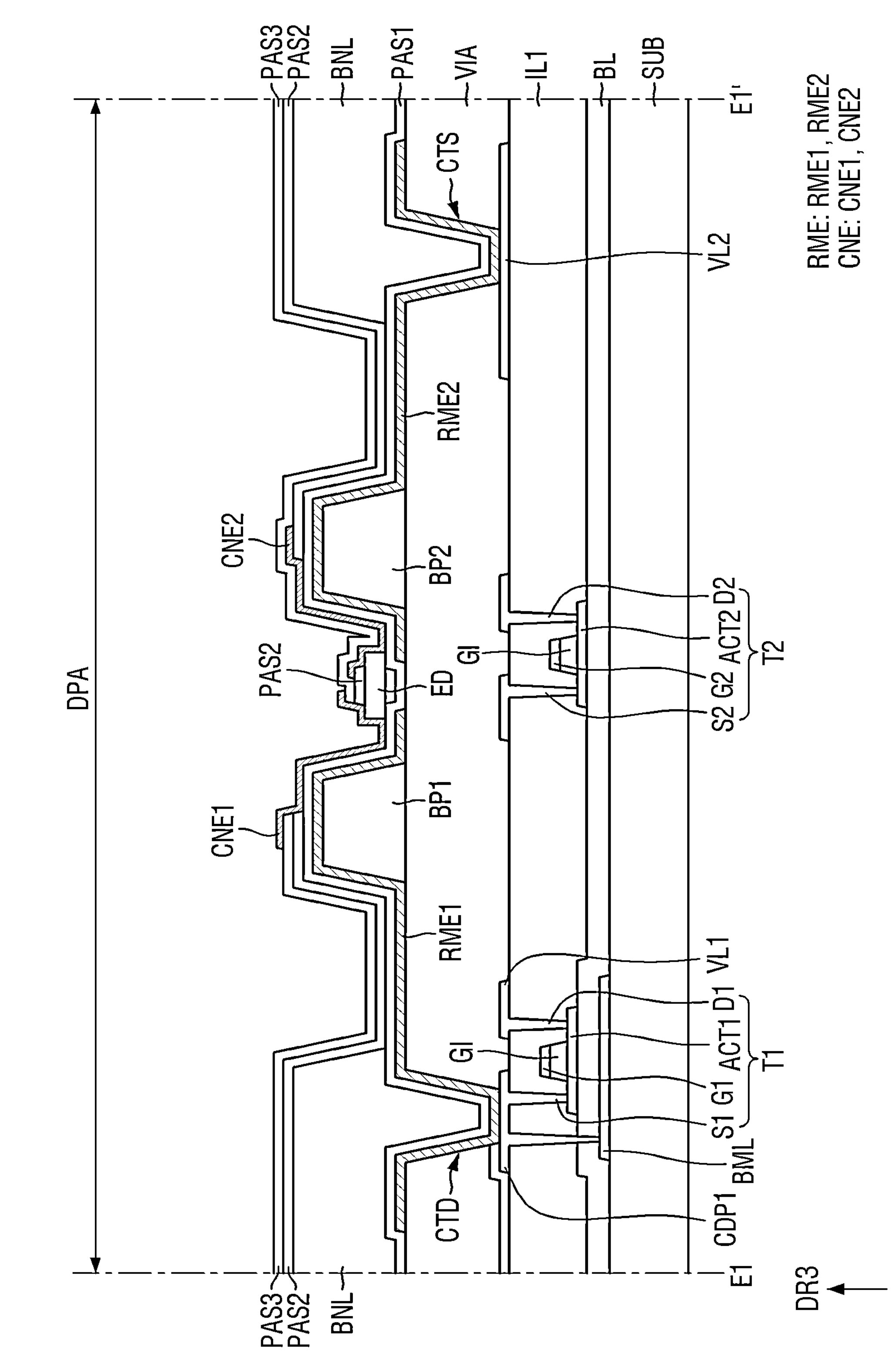
FIG. 4 is a schematic cross-sectional view taken along line E1-E1' of FIG. 3.
Figure 5:
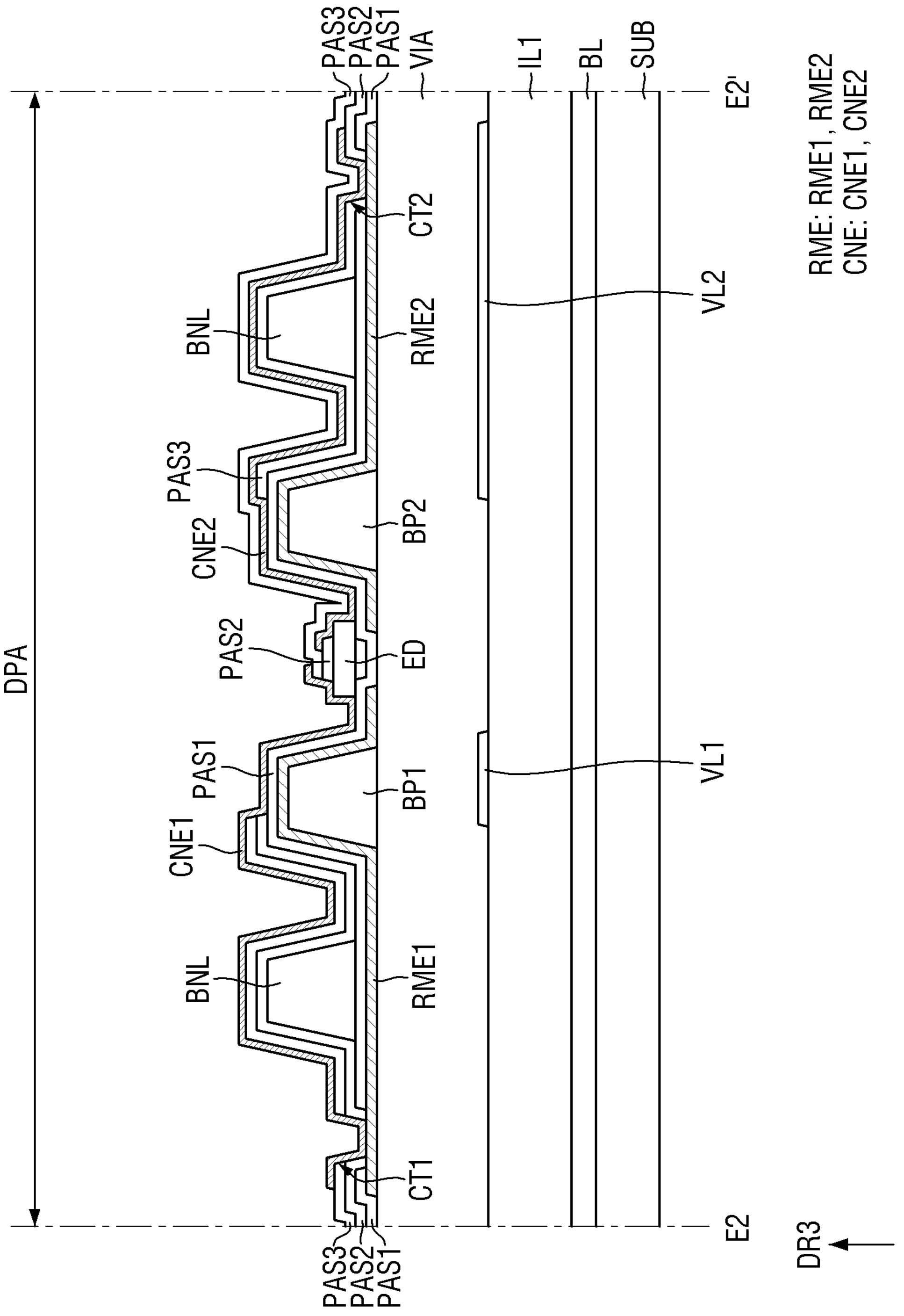
FIG. 5 is a schematic cross-sectional view taken along line E2-E2' of FIG. 3.

FIG. 4 is a schematic cross-sectional view taken along line E1-E1' of FIG. 3. FIG. 5 is a schematic cross-sectional view taken along line E2-E2' of FIG. 3.

FIG. 4 illustrates a cross section across both ends of a light emitting element ED and electrode contact holes CTD and CTS disposed in the first subpixel SPX1. FIG. 5 illustrates a cross section across both ends of a light emitting element ED and contact portions CT1 and CT2 disposed in the first subpixel SPX1.

The cross-sectional structure of the display device 10 will be described with reference to FIGS. 3 through 5. The display device 10 may include a substrate SUB and a semiconductor layer, conductive layers and insulating layers disposed on the substrate SUB. The display device 10 may include the electrodes RME (RME1 and RME2), the light emitting elements ED, and the connection electrodes CNE (CNE1 and CNE2). The semiconductor layer, the conductive layers, and the insulating layers may constitute a circuit layer CCL (see FIG. 7) of the display device 10.

The substrate SUB may be an insulating substrate. The substrate SUB may be made of an insulating material such as glass, quartz, or polymer resin. The substrate SUB may be a rigid substrate, but may also be a flexible substrate that may be bent, folded, rolled, etc. The substrate SUB may include the display area DPA and the non-display area NDA surrounding the display area DPA, and the display area DPA may include the emission area EMA and the sub-area SA which may be a portion of the non-emission area.

A first conductive layer may be disposed on the substrate SUB. The first conductive layer includes a bottom metal layer BML, and the bottom metal layer BML may be overlapped by a first active layer ACT1 of a first transistor T1. The bottom metal layer BML may prevent light from entering the first active layer ACT1 of the first transistor T1 or may be electrically connected to the first active layer ACT1 to stabilize electrical characteristics of the first transistor T1. However, the bottom metal layer BML may also be omitted.

A buffer layer BL may be disposed on the bottom metal layer BML and the substrate SUB. The buffer layer BL may be formed on the substrate SUB to protect transistors of the pixels PX from moisture introduced through the substrate SUB which may be vulnerable to moisture penetration and may perform a surface planarization function.

The semiconductor layer may be disposed on the buffer layer BL. The semiconductor layer may include the first active layer ACT1 of the first transistor T1 and a second active layer ACT2 of a second transistor T2. The first active layer ACT1 and the second active layer ACT2 may respectively be partially overlapped by a first gate electrode G1 and a second gate electrode G2 of a second conductive layer which will be described later.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although the first transistor T1 and the second transistor T2 may be disposed in each subpixel SPXn of the display device 10 in the drawings, the disclosure is not limited thereto, and the display device 10 may include a greater number of transistors.

A first gate insulating layer GI may be disposed on the semiconductor layer in the display area DPA. The first gate insulating layer GI may serve as a gate insulating film of each of the transistors T1 and T2. In the drawings, the first gate insulating layer GI may be patterned together with the gate electrodes G1 and G2 of the second conductive layer to be described later and thus may be partially disposed between the second conductive layer and the active layers ACT1 and ACT2 of the semiconductor layer. However, the disclosure is not limited thereto. In embodiments, the first gate insulating layer GI may be disposed on the entire surface of the buffer layer BL.

The second conductive layer may be disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is the thickness direction, and the second gate electrode G2 may overlap a channel region of the second active layer ACT2 in the third direction DR3 which is the thickness direction.

A first interlayer insulating layer IL1 may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer ILL The third conductive layer may include a first voltage wiring VL1 and a second voltage wiring VL2 disposed in the display area DPA, a first conductive pattern CDP1, and a source electrode S1 or S2 and a drain electrode D1 or D2 of each of the transistors T1 and T2.

A high potential voltage (or a first power supply voltage) supplied to the first electrode RME1 may be applied to the first voltage wiring VL1, and a low potential voltage (or a second power supply voltage) supplied to the second electrode RME2 may be applied to the second voltage wiring VL2. A portion of the first voltage wiring VL1 may contact the first active layer ACT1 of the first transistor T1 through a contact hole penetrating the first interlayer insulating layer ILL The first voltage wiring VL1 may serve as a first drain electrode D1 of the first transistor T1. The second voltage wiring VL2 may be directly connected to the second electrode RME2 to be described later.

The first conductive pattern CDP1 may contact the first active layer ACT1 of the first transistor T1 through a contact hole penetrating the first interlayer insulating layer ILL The first conductive pattern CDP1 may contact the bottom metal layer BML, through another contact hole penetrating the first interlayer insulating layer IL1 and the buffer layer BL. The first conductive pattern CDP1 may serve as a first source electrode S1 of the first transistor T1. The first conductive pattern CDP1 may be connected to the first electrode RME1 or the first connection electrode CNE1 to be described later. The first transistor T1 may transmit the first power supply voltage received from the first voltage wiring VL1 to the first electrode RME1 or the first connection electrode CNE1.

Each of a second source electrode S2 and a second drain electrode D2 may contact the second active layer ACT2 of the second transistor T2 through a contact hole penetrating the first interlayer insulating layer IL1.

Each of the buffer layer BL, the first gate insulating layer GI, and the first interlayer insulating layer IL1 described above may be composed of inorganic layers stacked alternately. For example, each of the buffer layer BL, the first gate insulating layer GI, and the first interlayer insulating layer IL1 may be a double layer in which inorganic layers including at least any one of silicon oxide ($SiO_x$), silicon nitride ($SiN_x$) and silicon oxynitride ($SiO_xN_y$) may be stacked or may be a multilayer in which the above inorganic layers may be alternately stacked. However, the disclosure is not limited thereto, and each of the buffer layer BL, the first gate insulating layer GI, and the first interlayer insulating layer IL1 may also be composed of one inorganic layer including any one of the above insulating materials. In embodiments, the first interlayer insulating layer IL1 may be made of an organic insulating material such as polyimide (PI).

A via layer VIA may be disposed on the third conductive layer in the display area DPA. The via layer VIA may include an organic insulating material such as polyimide (PI) to compensate for steps formed by the conductive layers under the via layer VIA and may form a flat upper surface. However, in embodiments, the via layer VIA may be omitted.

The display device 10 may include, as a display element layer disposed on the via layer VIA, the bank patterns BP1 and BP2, the electrodes RME (RME1 and RME2), the bank layer BNL, the light emitting elements ED, and the connection electrodes CNE (CNE1 and CNE2). The display device 10 may include insulating layers PAS1 through PAS4 disposed on the via layer VIA.

The bank patterns BP1 and BP2 may be disposed on the via layer VIA. For example, the bank patterns BP1 and BP2 may be directly disposed on the via layer VIA, and at least a portion of each of the bank patterns BP1 and BP2 may protrude from the upper surface of the via layer VIA. The protruding portion of each of the bank patterns BP1 and BP2 may have inclined side surfaces or curved side surfaces with a curvature, and light emitted from the light emitting elements ED may be reflected upward above the via layer VIA by the electrodes RME disposed on the bank patterns BP1 and BP2. Unlike in the drawings, each of the bank patterns BP1 and BP2 may also have a shape having an outer surface curved with a curvature in cross section, for example, may have a semicircular or semielliptical shape. The bank patterns BP1 and BP2 may include, but are not limited to, an organic insulating material such as polyimide (PI).

The electrodes RME (RME1 and RME2) may be disposed on the bank patterns BP1 and BP2 and the via layer VIA. For example, the first electrode RME1 and the second electrode RME2 may be disposed on at least the inclined side surfaces of the bank patterns BP1 and BP2. Widths of the electrodes RME measured in the second direction DR2 may be smaller than widths of the bank patterns BP1 and BP2 measured in the second direction DR2, and a distance between the first electrode RME1 and the second electrode RME2 in the second direction DR2 may be smaller than a distance between the bank patterns BP1 and BP2. At least a portion of each of the first electrode RME1 and the second electrode RME2 may be directly disposed on the via layer VIA so that they lie in the same plane.

The light emitting elements ED disposed between the bank patterns BP1 and BP2 may emit light in directions toward both ends of the light emitting elements ED, and the emitted light may travel toward the electrodes RME disposed on the bank patterns BP1 and BP2. Each electrode RME may have a structure in which a portion disposed on a bank pattern BP1 or BP2 can reflect light emitted from the light emitting elements ED. Each of the first electrode RME1 and the second electrode RME2 may cover at least one side surface of the bank pattern BP1 or BP2 to reflect light emitted from the light emitting elements ED.

Each of the electrodes RME may directly contact the third conductive layer through an electrode contact hole CTD or CTS in a portion overlapping the bank layer BNL between the emission area EMA and the sub-area SA. A first electrode contact hole CTD may be formed in an area in which the bank layer BNL and the first electrode RME1 overlap, and a second electrode contact hole CTS may be formed in an area in which the bank layer BNL and the second electrode RME2 overlap. The first electrode RME1 may contact the first conductive pattern CDP1 through the first electrode contact hole CTD penetrating the via layer VIA. The second electrode RME2 may contact the second voltage wiring VL2 through the second electrode contact hole CTS penetrating the via layer VIA. The first electrode RME1 may be electrically connected to the first transistor T1 through the first conductive pattern CDP1 to receive the first power supply voltage, and the second electrode RME2 may be electrically connected to the second voltage wiring VL2 to receive the second power supply voltage. However, the disclosure is not limited thereto. In an embodiment, the electrodes RME1 and RME2 may not be electrically connected to the voltage wirings VL1 and VL2 of the third conductive layer, and the connection electrodes CNE to be described later may be directly connected to the third conductive layer.

The electrodes RME may include a conductive material having high reflectivity. For example, each of the electrodes RME may include a metal such as silver (Ag), copper (Cu) or aluminum (Al), may be an alloy including aluminum (Al), nickel (Ni) or lanthanum (La), or may have a structure in which a metal layer such as titanium (Ti), molybdenum (Mo) or niobium (Nb) and the above alloy may be stacked. In embodiments, each of the electrodes RME may be a double layer or a multilayer in which an alloy including aluminum (Al) and at least one metal layer made of titanium (Ti), molybdenum (Mo) or niobium (Nb) may be stacked.

However, the disclosure is not limited thereto, and each electrode RME may further include a transparent conductive material. For example, each electrode RME may include a material such as ITO, IZO or ITZO. In embodiments, each electrode RME may have a structure in which a transparent conductive material and a metal layer having high reflectivity may each be stacked in one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED in an upward direction above the substrate SUB.

A first insulating layer PAS1 may be disposed in the entire display area DPA and may be disposed on the via layer VIA and the electrodes RME. The first insulating layer PAS1 may include an insulating material to protect the electrodes RME while insulating them from each other. Since the first insulating layer PAS1 covers the electrodes RME before the bank layer BNL may be formed, it may prevent the electrodes RME from being damaged in the process of forming the bank layer BNL. The first insulating layer PAS1 may prevent direct contact of the light emitting elements ED on the first insulating layer PAS1 with other members and thus prevent damage to the light emitting elements ED.

In an embodiment, the first insulating layer PAS1 may be stepped such that a portion of an upper surface of the first insulating layer PAS1 may be recessed between the electrodes RME spaced apart from each other in the second direction DR2. The light emitting elements ED may be disposed on the stepped upper surface of the first insulating layer PAS1, and a space may be formed between the light emitting elements ED and the first insulating layer PAS1.

The first insulating layer PAS1 may include contact portions CT1 and CT2 disposed in the sub-area SA. The contact portions CT1 and CT2 may overlap different electrodes RME, respectively. For example, the contact portions CT1 and CT2 may include a first contact portion CT1 overlapping the first electrode RME1 and a second contact portion CT2 overlapping the second electrode RME2. Each of the first and second contact portions CT1 and CT2 may penetrate the first insulating layer PAS1 to expose a portion of an upper surface of the first electrode RME1 or the second electrode RME2 under the contact portion CT1 or CT2. Each of the first and second contact portions CT1 and CT2 may further penetrate some of the other insulating layers disposed on the first insulating layer PAS1. An electrode RME exposed by each of the contact portions CT1 and CT2 may contact a connection electrode CNE.

The bank layer BNL may be disposed on the first insulating layer PAS1. The bank layer BNL may include portions extending in the first direction DR1 and the second direction DR2 and may surround each subpixel SPXn. The bank layer BNL may surround the emission area EMA and the sub-area SA of each subpixel SPXn to separate them and may surround the outermost periphery of the display area DPA to separate the display area DPA and the non-display area NDA.

Like the bank patterns BP1 and BP2, the bank layer BNL may have a height. In embodiments, an upper surface of the bank layer BNL may be at a greater height than those of the bank patterns BP1 and BP2, and a thickness of the bank layer BNL may be equal to or greater than those of the bank patterns BP1 and BP2. The bank layer BNL may prevent ink from overflowing to adjacent subpixels SPXn in an inkjet printing process during a manufacturing process of the display device 10. Like the bank patterns BP1 and BP2, the bank layer BNL may include an organic insulating material such as polyimide.

The light emitting elements ED may be disposed in the emission area EMA. The light emitting elements ED may be disposed on the first insulating layer PAS1 between the bank patterns BP1 and BP2. A direction in which the light emitting elements ED extend may be substantially parallel to an upper surface of the substrate SUB. As will be described later, each light emitting element ED may include semiconductor layers disposed along the extending direction, and the semiconductor layers may be sequentially disposed along a direction parallel to the upper surface of the substrate SUB. However, the disclosure is not limited thereto. In case that each of the light emitting elements ED has a different structure, the semiconductor layers may be disposed in a direction perpendicular to the substrate SUB.

The light emitting elements ED disposed in the subpixels SPXn may emit light of different wavelength bands depending on the materials that form the semiconductor layers described above. However, the disclosure is not limited thereto, and the light emitting elements ED disposed in the subpixels SPXn may also emit light of the same color by including the semiconductor layers made of the same material.

The light emitting elements ED may be electrically connected to the electrodes RME and the conductive layers under the via layer VIA by contacting the connection electrodes CNE (CNE1 and CNE2) and may emit light of a specific wavelength band in response to an electrical signal.

A second insulating layer PAS2 may be disposed on the light emitting elements ED, the first insulating layer PAS1, and the bank layer BNL. The second insulating layer PAS2 includes a pattern portion extending in the first direction DR1 between the bank patterns BP1 and BP2 and disposed on the light emitting elements ED. The pattern portion may partially cover outer surfaces of the light emitting elements ED and may not cover both sides or both ends of the light emitting elements ED. The pattern portion may form a linear or island-shaped pattern in each subpixel SPXn in a plan view. The pattern portion of the second insulating layer PAS2 may protect the light emitting elements ED while anchoring the light emitting elements ED in the manufacturing process of the display device 10. The second insulating layer PAS2 may fill the space between the light emitting elements ED and the first insulating layer PAS1 under the light emitting elements ED. A portion of the second insulating layer PAS2 may be disposed on the bank layer BNL and in the sub-areas SA.

The second insulating layer PAS2 may include the contact portions CT1 and CT2 disposed in the sub-area SA. The second insulating layer PAS2 may include the first contact portion CT1 overlapping the first electrode RME1 and the second contact portion CT2 overlapping the second electrode RME2. The contact portions CT1 and CT2 may penetrate the second insulating layer PAS2 in addition to the first insulating layer PAS1. Each of the first and second contact portions CT1 and CT2 may expose a portion of the upper surface of the first electrode RME1 or the second electrode RME2 under the contact portion CT1 or CT2.

The connection electrodes CNE (CNE1 and CNE2) may be disposed on the electrodes RME and the bank patterns BP1 and BP2. The first connection electrode CNE1 may be disposed on the first electrode RME1 and the first bank pattern BP1. The first connection electrode CNE1 may partially overlap the first electrode RME1 and may extend from the emission area EMA to the sub-area SA beyond the bank layer BNL. The second connection electrode CNE2 may be disposed on the second electrode RME2 and the second bank pattern BP2. The second connection electrode CNE2 may partially overlap the second electrode RME2 and may extend from the emission area EMA to the sub-area SA beyond the bank layer BNL.

Each of the first connection electrode CNE1 and the second connection electrode CNE2 may be disposed on the second insulating layer PAS2 and may contact the light emitting elements ED. The first connection electrode CNE1 may partially overlap the first electrode RME1 and may contact an end of each light emitting element ED. The second connection electrode CNE2 may partially overlap the second electrode RME2 and may contact the other end of each light emitting element ED. The connection electrodes CNE may be disposed over the emission area EMA and the sub-area SA. Each of the connection electrodes CNE may contact the light emitting elements ED in a portion disposed in the emission area EMA and may be electrically connected to the third conductive layer in a portion disposed in the-sub area SA. The first connection electrode CNE1 may contact first ends of the light emitting elements ED, and the second connection electrode CNE2 may contact second ends of the light emitting elements ED.

According to an embodiment, in the display device 10, each of the connection electrodes CNE may contact an electrode RME through a contact portion CT1 or CT2 disposed in the sub-area SA. The first connection electrode CNE1 may contact the first electrode RME1 through the first contact portion CT1 penetrating the first insulating layer PAS1, the second insulating layer PAS2 and a third insulating layer PAS3 in the sub-area SA. The second connection electrode CNE2 may contact the second electrode RME2 through the second contact portion CT2 penetrating the first insulating layer PAS1 and the second insulating layer PAS2 in the sub-area SA. The connection electrodes CNE may be electrically connected to the third conductive layer through the electrodes RME, respectively. The first connection electrode CNE1 may be electrically connected to the first transistor T1 to receive the first power supply voltage, and the second connection electrode CNE2 may be electrically connected to the second voltage wiring VL2 to receive the second power supply voltage. Each of the connection electrodes CNE may contact the light emitting elements ED in the emission area EMA to transmit a power supply voltage to the light emitting elements ED.

However, the disclosure is not limited thereto. In embodiments, the connection electrodes CNE may directly contact the third conductive layer or may be electrically connected to the third conductive layer through patterns other than the electrodes RME.

The connection electrodes CNE may include a conductive material such as ITO, IZO, ITZO, or aluminum (Al). For example, the connection electrodes CNE may include a transparent conductive material, and light emitted from the light emitting elements ED may be output through the connection electrodes CNE.

The third insulating layer PAS3 may be disposed on the second connection electrode CNE2 and the second insulating layer PAS2. The third insulating layer PAS3 may be disposed on the entire surface of the second insulating layer PAS2 to cover the second connection electrode CNE2, and the first connection electrode CNE1 may be disposed on the third insulating layer PAS3. The third insulating layer PAS3 may insulate the first connection electrode CNE1 and the second connection electrode CNE2 from each other so that they do not directly contact each other.

The third insulating layer PAS3 may include the first contact portion CT1 disposed in the sub-area SA. The first contact portion CT1 may penetrate the third insulating layer PAS3 in addition to the first insulating layer PAS1 and the second insulating layer PAS2. The first contact portion CT1 may expose a portion of the upper surface of the first electrode RME1 under the first contact portion CT1.

Although not illustrated in the drawings, another insulating layer PAS4 (see FIG. 7) may be further disposed on the third insulating layer PAS3 and the first connection electrode CNE1. The insulating layer may protect members disposed on the substrate SUB from an external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2 and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least any one of the first insulating layer PAS1, the second insulating layer PAS2 and the third insulating layer PAS3 may be formed in a structure in which insulating layers may be alternately or repeatedly stacked. In an embodiment, each of the first insulating layer PAS1, the second insulating layer PAS2 and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material, or some may be made of the same material while the others may be made of different materials, or all of them may be made of different materials.

Figure 6:
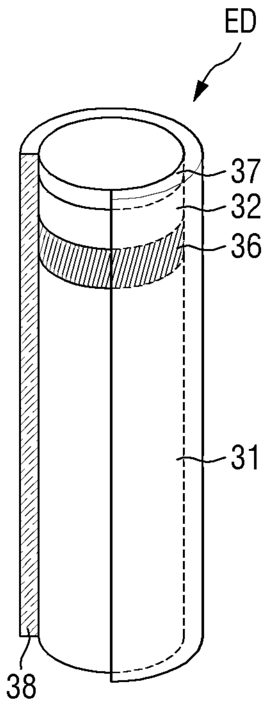
FIG. 6 is a schematic view of a light emitting element according to an embodiment.

FIG. 6 is a schematic view of a light emitting element ED according to an embodiment.

Referring to FIG. 6, the light emitting element ED may be a light emitting diode. For example, the light emitting element ED may be an inorganic light emitting diode having a size of nanometers to micrometers and made of an inorganic material. In case that an electric field is formed in a specific direction between two electrodes facing each other, the light emitting element ED may be aligned between the two electrodes in which polarities may be formed.

The light emitting element ED according to the embodiment may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped or a hexagonal prism, and a shape extending in a direction and having a partially inclined outer surface.

The light emitting element ED may include a semiconductor layer doped with a dopant of any conductivity type (e.g., a p-type or an n-type). The semiconductor layer may receive an electrical signal from an external power source and emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 may be disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN, and InN doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include more layers, for example, may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, and SLs doped with an n-type dopant. The semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which quantum layers and well layers may be alternately stacked. The light emitting layer 36 may emit light through combination of electron-hole pairs according to electrical signals received through the first semiconductor layer 31 and the second semiconductor layer 32. The light emitting layer 36 may include a material such as AlGaN, AlGaInN, or InGaN. In case that the light emitting layer 36 has a multiple quantum well structure in which a quantum layer and a well layer may be alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy may be alternately stacked or may include different group III to V semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to electrodes or connection electrodes in the display device 10, the electrode layer 37 may reduce the resistance between the light emitting element ED and the electrodes or the connection electrodes. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround an outer surface of at least the light emitting layer 36 but may expose both ends of the light emitting element ED in a longitudinal direction. An upper surface of the insulating film 38 may be rounded in cross section in an area adjacent to at least one end of the light emitting element ED.

The insulating film 38 may include an insulating material, for example, at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is illustrated as a single layer in the drawing, the disclosure is not limited thereto. In embodiments, the insulating film 38 may be formed in a multilayer structure in which layers may be stacked.

The insulating film 38 may protect the semiconductor layers and the electrode layer of the light emitting element ED. The insulating film 38 may prevent an electrical short circuit that may occur in the light emitting layer 36 in case that the light emitting layer 36 directly contacts an electrode that transmits an electrical signal to the light emitting element ED. The insulating film 38 may prevent a reduction in luminous efficiency of the light emitting element ED.

An outer surface of the insulating film 38 may be treated. The light emitting element ED may be sprayed onto electrodes in a state where it may be dispersed in an ink and may be aligned, Here, the surface of the insulating film 38 may be hydrophobic or hydrophilic treated so that the light emitting element ED may be kept separate in the ink without being agglomerated with other adjacent light emitting elements ED.

According to an embodiment, the display device 10 may further include a color control layer CCR (see FIG. 7) and a color filter layer CFL (see FIG. 7) disposed on the light emitting elements ED. Light emitted from the light emitting elements ED may be output through the color control layer CCR and the color filter layer CFL. Even if the same type of light emitting elements ED may be disposed in the subpixels SPXn, the color of light emitted from each subpixel SPXn may be different.

Figure 7:
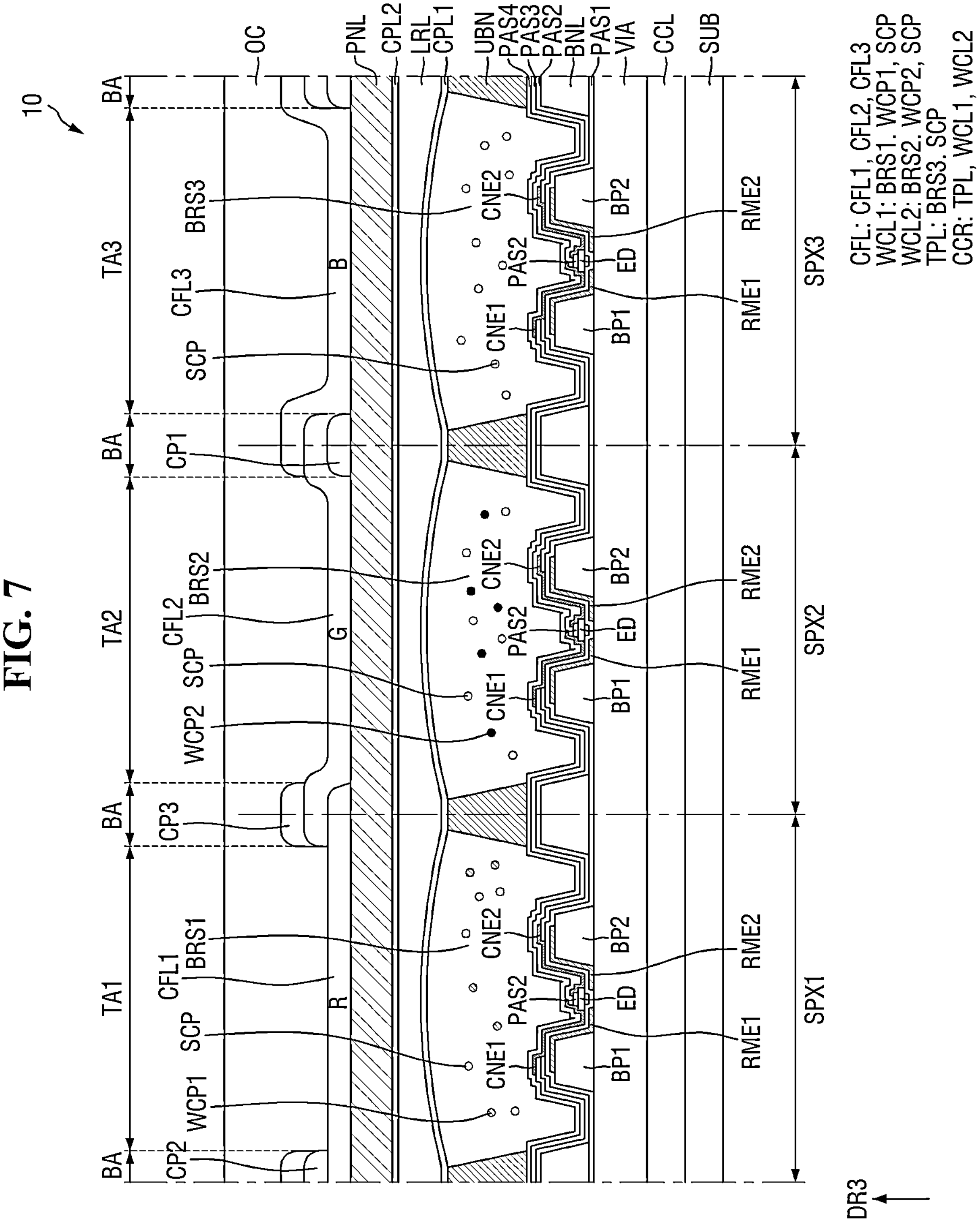
FIG. 7 is a schematic cross-sectional view of the display device according to an embodiment.

FIG. 7 is a schematic cross-sectional view of the display device 10 according to an embodiment.

Referring to FIG. 7, the display device 10 may include the light emitting elements ED disposed on the substrate SUB and the color control layer CCR and the color filter layer CFL disposed on the light emitting elements ED. The display device 10 may further include layers disposed between the color control layer CCR and the color filter layer CFL. Layers disposed on the light emitting elements ED of the display device 10 will now be described.

A fourth insulating layer PAS4 may be disposed on the third insulating layer PAS3, the connection electrodes CNE1 and CNE2, and the bank layer BNL. The fourth insulating layer PAS4 may protect the layers disposed on the substrate SUB. However, the fourth insulating layer PAS4 may also be omitted.

An upper bank layer UBN, the color control layer CCR, color patterns CP1 through CP3, and the color filter layer CFL may be disposed on the fourth insulating layer PAS4. Capping layers CPL1 and CPL2, a low refractive index layer LRL and a planarization layer PNL may be disposed between the color control layer CCR and the color filter layer CFL, and an overcoat layer OC may be disposed on the color filter layer CFL.

The display device 10 may include light transmitting areas TA1 through TA3 in which the color filter layer CFL may be disposed to output light and a light blocking area BA which may be disposed between the light transmitting areas TA1 through TA3 and from which no light may be output. Each of the light transmitting areas TA1 through TA3 may be located to correspond to a portion of the emission area EMA of a subpixel SPXn, and the light blocking area BA may be an area other than the light transmitting areas TA1 through TA3.

The upper bank layer UBN may be disposed on the fourth insulating layer PAS4 to overlap the bank layer BNL. The upper bank layer UBN may include portions extending in the first direction DR1 and the second directions DR2 in a grid pattern. The upper bank layer UBN may surround the emission areas EMA or portions in which the light emitting elements ED may be disposed and may separate the subpixels SPXn, each including the emission area EMA and the sub-area SA, together with the bank layer BNL described above. The upper bank layer UBN may form areas in which the color control layer CCR may be disposed.

In an embodiment, the upper bank layer UBN may be made of a photosensitive resin composition which will be described later. The photosensitive resin composition may have a high photocuring rate and a high ratio of hydrophilic components. Accordingly, ink may be spread well on a surface of the fourth insulating layer PAS4 to which the ink may be applied. This will be described in more detail later.

The color control layer CCR may be disposed on the fourth insulating layer PAS4 in areas surrounded by the upper bank layer UBN. The color control layer CCR may directly contact the surface of the fourth insulating layer PAS4. The color control layer CCR may be disposed in each of the light transmitting areas TA1 through TA3 surrounded by the upper bank layer UBN to form an island-shaped pattern in the display area DPA. However, the disclosure is not limited thereto, and the color control layer CCR disposed in each of the light transmitting areas TA1 through TA3 may also extend in a direction across multiple subpixels SPXn to form a linear pattern.

In an embodiment in which the light emitting elements ED of each subpixel SPXn emit blue light of the third color, the color control layer CCR may include a first wavelength conversion layer WCL1 disposed in the first subpixel SPX1 to correspond to the first light transmitting area TA1, a second wavelength conversion layer WCL2 disposed in the second subpixel SPX2 to correspond to the second light transmitting area TA2, and a light transmitting layer TPL disposed in the third subpixel SPX3 to correspond to the third light transmitting area TA3.

The first wavelength conversion layer WCL1 may include a first base resin BRS1 and first wavelength conversion materials WCP1 disposed in the first base resin BRS1. The second wavelength conversion layer WCL2 may include a second base resin BRS2 and second wavelength conversion materials WCP2 disposed in the second base resin BRS2. The first wavelength conversion layer WCL1 and the second wavelength conversion layer WCL2 convert the wavelength of the blue light of the third color incident from the light emitting elements ED and transmit the converted light. Each of the first wavelength conversion layer WCL1 and the second wavelength conversion layer WCL2 may further include scatterers SCP included in the base resin BRS1 or BRS2, and the scatterers SCP may increase wavelength conversion efficiency.

The light transmitting layer TPL may include a third base resin BRS3 and scatterers SCP disposed in the third base resin BSR3. The light transmitting layer TPL transmits the blue light of the third color incident from the light emitting elements ED while maintaining the wavelength of the blue light. The scatterers SCP of the light transmitting layer TPL may adjust an emission path of light output emitted through the light transmitting layer TPL. The light transmitting layer TPL may not include wavelength conversion materials.

The scatterers SCP may be metal oxide particles or organic particles. The metal oxide may be, for example, titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The organic particles may be made of a material such as acrylic resin or urethane resin.

The first through third base resins BRS1 through BRS3 may include a light transmitting organic material. For example, the first through third base resins BRS1 through BRS3 may include epoxy resin, acrylic resin, cardo resin, or imide resin. The first through third base resins BRS1 through BRS3 may all be made of the same material, but the disclosure is not limited thereto.

The first wavelength conversion materials WCP1 may convert the blue light of the third color into red light of the first color, and the second wavelength conversion materials WCP2 may convert the blue light of the third color into green light of the second color. The first wavelength conversion materials WCP1 and the second wavelength conversion materials WCP2 may be quantum dots, quantum rods, or phosphors. The quantum dots may include group IV nanocrystals, group II-VI compound nanocrystals, group III-V compound nanocrystals, group IV-VI nanocrystals, or a combination thereof.

In embodiments, the color control layer CCR may be formed through an inkjet printing process or a photoresist process. The color control layer CCR may be formed by spraying or applying materials that form the color control layer CCR into the areas surrounded by the upper bank layer UBN and then drying or exposing and developing the materials. For example, in an embodiment in which the color control layer CCR may be formed through an inkjet printing process, an upper surface of each layer of the color control layer CCR may be formed to be curved so that edge portions adjacent to the upper bank layer UBN may be lower than a central portion. However, the disclosure is not limited thereto. In an embodiment in which the color control layer CCR may be formed through a photoresist process, the upper surface of each layer of the color control layers CCR may be formed to be flat so that the edge portions adjacent to the upper bank layer UBN may be parallel to an upper surface of the upper bank layer UBN, or the central portion of the color control layer CCR may be formed to be higher unlike in the drawing.

The light emitting elements ED of the subpixels SPXn may emit the same blue light of the third color, and light output from the subpixels SPXn may be light of different colors. For example, light emitted from the light emitting elements ED disposed in the first subpixel SPX1 may be incident on the first wavelength conversion layer WCL1, light emitted from the light emitting elements ED disposed in the second subpixel SPX2 may be incident on the second wavelength conversion layer WCL2, and light emitted from the light emitting elements ED disposed in the third subpixel SPX3 may be incident on the light transmitting layer TPL.

The light incident on the first wavelength conversion layer WCL1 may be converted into red light, the light incident on the second wavelength conversion layer WCL2 may be converted into green light, and the light incident on the light transmitting layer TPL may be transmitted as the same blue light without wavelength conversion. Even if the subpixels SPXn include the light emitting elements ED emitting light of the same color, light of different colors may be output according to the arrangement of the color control layer CCR disposed on the light emitting elements ED.

A first capping layer CPL1 may be disposed on the color control layer CCR and the upper bank layer UBN. The first capping layer CPL1 may prevent damage or contamination of the color control layer CCR by preventing penetration of impurities such as moisture or air from the outside. The first capping layer CPL1 may include an inorganic insulating material.

The low refractive index layer LRL may be disposed on the first capping layer CPL1. The low refractive index layer LRL may be an optical layer that recycles light passing through the color control layer CCR and may improve the light output efficiency and color purity of the display device 10. The low refractive index layer LRL may be made of an organic material having a low refractive index and may compensate for steps formed by the color control layer CCR and the upper bank layer UBN.

A second capping layer CPL2 may be disposed on the low refractive index layer LRL and may prevent damage or contamination of the low refractive index layer LRL by preventing penetration of impurities such as moisture or air from the outside. Like the first capping layer CPL1, the second capping layer CPL2 may include an inorganic insulating material.

The planarization layer PNL may be disposed on the second capping layer CPL2 over the entire surface of the display area DPA and the non-display area NDA. The planarization layer PNL may overlap the color control layer CCR in the display area DPA and may overlap a dam to be described later in the non-display area NDA.

The capping layers CPL1 and CPL2 and the low refractive index layer LRL, the planarization layer PNL may protect members disposed on the substrate SUB and may partially compensate for steps formed by them. For example, the planarization layer PNL may compensate for steps formed by the color control layer CCR, the upper bank layer UBN and the bank layer BNL under the planarization layer PNL in the display area DPA, so that the color filter layer CFL disposed on the planarization layer PNL may be formed on a flat surface.

The color filter layer CFL may be disposed on the planarization layer PNL. The color filter layer CFL may be disposed in the light transmitting areas TA1 through TA3, and a portion of the color filter layer CFL may be disposed in the light blocking area BA. A portion of the color filter layer CFL may overlap another portion or a color pattern CP1, CP2 or CP3 in the light blocking area BA. Areas in which portions of the color filter layer CFL do not overlap each other may be the light transmitting areas TA1 through TA3 from which light may be emitted, and an area in which portions of the color filter layer CFL overlap each other or the color patterns CP1 through CP3 may be disposed may be the light blocking area BA in which light emission may be blocked.

The color filter layer CFL may include a first color filter CFL1 disposed in the first subpixel SPX1, a second color filter CFL2 disposed in the second subpixel SPX2, and a third color filter CFL3 disposed in the third subpixel SPX3. The color filters CFL1 through CFL3 may be formed as linear patterns disposed in the light transmitting areas TAT through TA3 or the emission areas EMA. However, the disclosure is not limited thereto, and the color filters CFL1 through CFL3 may also be disposed to correspond to the light transmitting areas TA1 through TA3, respectively, and may form island-shaped patterns.

The color filter layer CFL may include a colorant such as a dye or pigment that absorbs light of wavelength bands other than light of a specific wavelength band. Each of the color filters CFL1 through CFL3 may be disposed in a corresponding subpixel SPXn to transmit only a portion of light incident on the color filter CFL1, CFL2 or CFL3 in the subpixel SPXn. In the subpixels SPXn of the display device 10, only light transmitted through the color filters CFL1 through CFL3 may be selectively displayed. In an embodiment, the first color filter CFL1 may be a red color filter layer, the second color filter CFL2 may be a green color filter layer, and the third color filter CFL3 may be a blue color filter layer. Light emitted from the light emitting elements ED may pass through the color control layer CCR and exit through the color filter layer CFL.

The color patterns CP1 through CP3 may be disposed on the planarization layer PNL or the color filter layer CFL. The color patterns CP1 through CP3 may include the same material as the color filter layer CFL and may be disposed in the light blocking area BA. In the light blocking area BA, a color pattern CP1, CP2 or CP3 and different color filters CFL1 through CFL3 may be stacked, and transmission of light may be blocked in an area where they may be stacked.

A first color pattern CP1 may include the same material as the first color filter CFL1 and may be disposed in the light blocking area BA. The first color pattern CP1 may be directly disposed on the planarization layer PNL in the light blocking area BA and may not be disposed in the light blocking area BA adjacent to the first light transmitting area TA1 of the first subpixel SPX1. The first color pattern CP1 may be disposed in the light blocking area BA between the second subpixel SPX2 and the third subpixel SPX3. The first color filter CFL1 may be disposed in the light blocking area BA around the first subpixel SPX1.

A second color pattern CP2 may include the same material as the second color filter CFL2 and may be disposed in the light blocking area BA. The second color pattern CP2 may be directly disposed on the planarization layer PNL in the light blocking area BA and may not be disposed in the light blocking area BA adjacent to the second light transmitting area TA2 of the second subpixel SPX2. The second color pattern CP2 may be disposed in the light blocking area BA between the first subpixel SPX1 and the third subpixel SPX3 or may be disposed at a boundary between an outermost subpixel SPXn of the display area DPA and the non-display area NDA. The second color filter CFL2 may be disposed in the light blocking area BA around the second subpixel SPX2.

Similarly, the third color pattern CP3 may include the same material as the third color filter CFL3 and may be disposed in the light blocking area BA. The third color pattern CP3 may be directly disposed on the planarization layer PNL in the light blocking area BA and may not be disposed in the light blocking area BA adjacent to the third light transmitting area TA3 of the third subpixel SPX3. The third color pattern CP3 may be disposed in the light blocking area BA between the first subpixel SPX1 and the second subpixel SPX2. The third color filter CFL3 may be disposed in the light blocking area BA around the third subpixel SPX3.

In the display device 10, an area overlapping the bank layer BNL and the upper bank layer UBN may be the light blocking area BA. In the light blocking area BA, each of the first color pattern CP1, the second color pattern CP2, and the third color pattern CP3 may overlap at least any one of the color filters CFL1 through CFL3 including colorants different from that of the color pattern CP1, CP2 or CP3. For example, the first color pattern CP1 may overlap the second color filter CFL2 and the third color filter CFL3, the second color pattern CP2 may overlap the first color filter CFL1 and the third color filter CFL3, and the third color pattern CP3 may overlap the first color filter CFL1 and the second color filter CFL2. In the light blocking area BA, the color patterns CP1 through CP3 and the color filters CFL1 through CFL3 including different colorants may overlap each other, thereby blocking light transmission.

The color patterns CP1 through CP3 may be stacked with the color filters CFL1 through CFL3 and may prevent color mixing between neighboring areas through materials including different colorants. Since the color patterns CP1 through CP3 may include the same materials as the color filters CFL1 through CFL3, external light or reflected light passing through the light blocking area BA may have a wavelength band of a specific color. A user's eye color sensibility varies according to the color of light. For example, light in a blue wavelength band may be perceived less sensitively by a user than light in a green wavelength band and light in a red wavelength band. The color patterns CP1 through CP3 disposed in the light blocking area BA of the display device 10 may block transmission of light, allow a user to perceive reflected light relatively less sensitively, and reduce reflected light due to external light by absorbing some of the light introduced from the outside of the display device 10.

The overcoat layer OC may be disposed on the color filter layer CFL and the color patterns CP1 through CP3. The overcoat layer OC may be disposed over the entire display area DPA, and a portion of the overcoat layer OC may also be disposed in the non-display area NDA. The overcoat layer OC may include an organic insulating material to protect the members disposed in the display area DPA from the outside.

Since the display device 10 according to an embodiment includes the color control layer CCR and the color filter layer CFL disposed on the light emitting elements ED, the subpixels SPXn may display light of different colors even if the light emitting elements ED of the same type are disposed in the subpixels SPXn.

For example, the light emitting elements ED disposed in the first subpixel SPX1 may emit blue light of the third color, and the light may pass through the fourth insulating layer PAS4 and enter the first wavelength conversion layer WCL1. The first base resin BRS1 of the first wavelength conversion layer WCL1 may be made of a transparent material. Thus, a portion of the light may pass through the first base resin BRS1 and enter the first capping layer CPL1 disposed on the first base resin BRS1. However, at least a portion of the light may enter the scatterers SCP and the first wavelength conversion materials WCP1 disposed in the first base resin BRS1 and may enter the first capping layer CPL1 as red light after being scattered and wavelength converted. The light incident on the first capping layer CPL1 may pass through the low refractive index layer LRL, the second capping layer CPL2 and the planarization layer PNL and enter the first color filter CFL1. The first color filter CFL1 may block transmission of light other than red light. Accordingly, red light may be output from the first subpixel SPX1.

Similarly, light emitted from the light emitting elements ED disposed in the second subpixel SPX2 may be output as green light after passing through the fourth insulating layer PAS4, the second wavelength conversion layer WCL2, the first capping layer CPL1, the low refractive index layer LRL, the second capping layer CPL2, the planarization layer PNL, and the second color filter CFL2.

The light emitting elements ED disposed in the third subpixel SPX3 may emit blue light of the third color, and the light may pass through the fourth insulating layer PAS4 and enter the light transmitting layer TPL. The third base resin BRS3 of the light transmitting layer TPL may be made of a transparent material. Thus, a portion of the light may pass through the third base resin BRS3 and enter the first capping layer CPL1 disposed on the third base resin BRS3. The light incident on the first capping layer CPL1 may pass through the low refractive index layer LRL, the second capping layer CPL2 and the planarization layer PNL and enter the third color filter CFL3. The third color filter CFL3 may block transmission of light other than blue light. Accordingly, blue light may be output from the third subpixel SPX3.

The color control layer CCR described above may be applied using an inkjet printing method to each subpixel SPXn defined by the upper bank layer UBN. The upper bank layer UBN may be prepared through coating, pre-baking, exposure, development, and post-baking processes. However, outgassing during post-baking may cause uncured residues of the upper bank layer UBN to be ejected onto the surface of the fourth insulating layer PAS4 to which ink may be applied, thereby rendering the surface of the fourth insulating layer PAS4 hydrophobic. Accordingly, the spreadability of the ink applied onto the fourth insulating layer PAS4 may be reduced.

Hereinafter, an embodiment discloses a photosensitive resin composition that can prevent ejection of uncured residues of the upper bank layer UBN by increasing the developability of the upper bank layer UBN.

A photosensitive resin composition according to an embodiment may include a binder, a photopolymerizable monomer, a photopolymerization initiator, an ultraviolet absorber, a solvent, and scattering particles.

The binder may improve the adhesion of the photosensitive resin composition to a substrate by adjusting the viscosity of the photosensitive resin composition, and in an embodiment, may improve the developability and reactivity of a pattern. As described above, outgassing during post-baking may cause uncured residues of the upper bank layer UBN (see FIG. 7) to be ejected onto the surface of the fourth insulating layer PAS4 (see FIG. 7) to which ink may be applied, thereby rendering the surface of the fourth insulating layer PAS4 hydrophobic. Accordingly, the spreadability of the ink applied onto the fourth insulating layer PAS4 may be reduced.

In an embodiment, in order to completely cure the photosensitive resin composition, a photocuring rate may be increased by increasing the content of repeating units contributing to photocuring, an exposure rate may be increased by increasing a unit functional group of acrylate and reducing a molecular weight, and a hydrophilic repeating unit may be included so that hydrophilic components may be ejected in case that uncured residues are ejected during outgassing. Here, the content may mean weight.

The binder according to an embodiment may include a first repeating unit represented by Chemical Formula 1 below, a second repeating unit represented by Chemical Formula 2 below, a third repeating unit including one or more repeating units each independently represented by one of Chemical Formula 3 to Chemical Formula 5, a fourth repeating unit including one or more repeating units each independently represented by one of Chemical Formula 4 and Chemical Formula 6, and a fifth repeating unit including one or more repeating units each independently represented by Chemical Formula 3 to Chemical Formula 8.

[Chemical Formula 1]

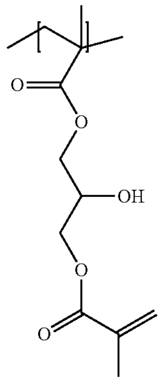

[Chemical Formula 2]

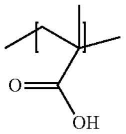

[Chemical Formula 3]

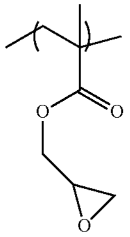

[Chemical Formula 4]

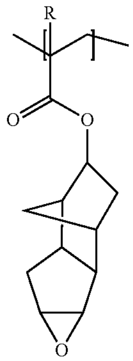

[Chemical Formula 5]

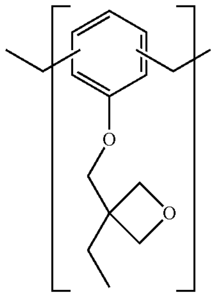

-continued

[Chemical Formula 6]

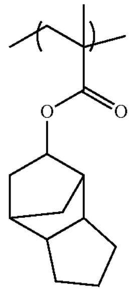

[Chemical Formula 7]

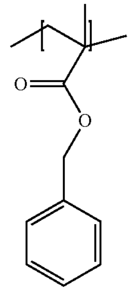

[Chemical Formula 8]

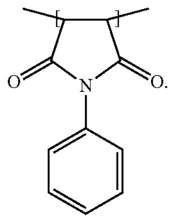

In Chemical Formula 4, R may be a substituted or unsubstituted $C_1$-$C_{10}$ alkyl group.

The first repeating unit represented by Chemical Formula 1 may contribute to a photoreaction during exposure. A content ratio of the first repeating unit may be in a range of about 30% to about 40% based on a total binder content. The photocuring rate may be increased by increasing an equivalent weight of the first repeating unit.

The second repeating unit represented by Chemical Formula 2 may control an acid value of the photosensitive resin composition. A content ratio of the second repeating unit may be in a range of about 20% to 30% based on a total binder content. The developability of the photosensitive resin composition may be increased.

The third repeating unit including one or more repeating units each independently represented by one of Chemical Formula 3 to Chemical Formula 5 may increase heat resistance of the photosensitive resin composition. The third repeating unit may include Chemical Formula 3, Chemical Formula 4, Chemical Formula 5, or any combination thereof. A content ratio of the third repeating unit may be in a range of about 10% to 20% based on a total binder content. The heat resistance of the photosensitive resin composition may be increased.

The fourth repeating unit including one or more repeating units each independently represented by one of Chemical Formula 4 and Chemical Formula 6 may increase a glass transition temperature Tg of the photosensitive resin composition and increase patternability. A content ratio of the fourth repeating unit may be in a range of about 5% to 15% based on a total binder content. The patternability of the photosensitive resin composition may be increased.

The fifth repeating unit including one or more repeating units each independently represented by one of Chemical Formula 3 to Chemical Formula 8 may have hydrophilicity and may increase the glass transition temperature Tg of the photosensitive resin composition. A content ratio of the fifth repeating unit may be in a range of about 10% to 20% based on a total binder content. Even if outgassing during post-baking causes uncured residues to be ejected onto the surface of the fourth insulating layer PAS4 to which ink may be applied, the surface of the fourth insulating layer PAS4 may be hydrophilic, thus preventing a reduction in the spreadability of the ink.

In an embodiment, a content ratio of the first repeating unit to the third repeating unit may be in a range of about 2:1 to about 3:1. The photocuring rate of the photosensitive resin composition may be increased, thus preventing a reduction in the spreadability of the ink due to non-curing. A content ratio of the fifth repeating unit to the third repeating unit may be in a range of about 1:1 to about 2:1. Even if outgassing during post-baking of the photosensitive resin composition causes uncured residues to be ejected onto the surface of the fourth insulating layer PAS4 to which ink may be applied, the surface of the fourth insulating layer PAS4 may be hydrophilic, thus preventing a reduction in the spreadability of the ink.

In an embodiment, the repeating units represented by Chemical Formula 3 and Chemical Formula 5 may be included in each of the third repeating unit and the fifth repeating unit, the repeating unit represented by Chemical Formula 4 may be included in each of the third repeating unit, the fourth repeating unit and the fifth repeating unit, and the repeating unit represented by Chemical Formula 6 may be included in each of the fourth repeating unit and the fifth repeating unit. A repeating unit (e.g., the repeating unit represented by Chemical Formula 3) repeatedly included in multiple repeating units may be distributed according to contents of the repeating units (e.g., the third repeating unit and the fifth repeating unit). For example, when the third repeating unit constitutes 10% of the total binder and the fifth repeating unit constitutes 10% of the total binder, if the repeating unit represented by Chemical Formula 3 constitutes as much as 20% of the total binder, 10% may be distributed to the third repeating unit, and 10% may be distributed to the fifth repeating unit to satisfy the requirements of the composition.

A content of the binder may be in a range of about 40 to about 60 parts by weight based on 100 parts by weight of a total solid content of the photosensitive resin composition.

The photopolymerizable monomer may form a pattern by causing a polymerization reaction during exposure. The photopolymerizable monomer may include a monofunctional ester of methacrylic acid having at least one ethylenically unsaturated double bond, a polyfunctional ester of methacrylic acid having at least one ethylenically unsaturated double bond, or a combination thereof. In case that a photopolymerizable compound has an ethylenically unsaturated double bond, it may cause sufficient polymerization during exposure. Therefore, it may be possible to form a pattern having excellent heat resistance, light fastness, and chemical resistance.

According to an embodiment, the photopolymerizable monomer may include ethylene glycol dimethacrylate, diethylene glycol dimethacrylate, triethylene glycol dimethacrylate, propylene glycol dimethacrylate, neopentyl glycol dimethacrylate, 1,4-butanediol dimethacrylate, 1,6-hexanediol dimethacrylate, bisphenol A dimethacrylate, pentaerythritol dimethacrylate, pentaerythritol trimethacrylate, pentaerythritol tetramethacrylate, pentaerythritol hexamethacrylate, dipentaerythritol dimethacrylate, dipentaerythritol trimethacrylate, dipentaerythritol pentamethacrylate, dipentaerythritol hexamethacrylate, bisphenol A epoxy methacrylate, ethylene glycol monomethylether methacrylate, trimethylol propane trimethacrylate, tri smethacryloyloxyethyl phosphate, novolac epoxy methacrylate, or a combination thereof.

A content of the photopolymerizable monomer may be in a range of about 20 to about 50 parts by weight based on 100 parts by weight of the total solid content of the photosensitive resin composition. In an embodiment, a content of the photopolymerizable monomer may be in a range of about 35 to about 45 parts by weight based on 100 parts by weight of the total solid content of the photosensitive resin composition. Pattern characteristics and developability may be excellent.

The photopolymerization initiator may initiate polymerization of the photopolymerizable monomer in response to a wavelength such as visible light, ultraviolet light, or far ultraviolet light. The photosensitive resin composition may include the photopolymerization initiator to have high photocurability.

The photopolymerization initiator may include an oxime-based compound, an acetophenone-based compound, a thioxanthone-based compound, a benzophenone-based compound, or a combination thereof.

The oxime-based compound may include, for example, 1,2-octanedione, 2-dimethylamino-2-(4-methylbenzyl)-1-(4-morpholin-4-yl-phenyl)-butan-1-one, 1-(4-phenyl sulfanylphenyl)-butane-1,2-dione-2-oxime-O-benzoate, 1-(4-phenyl sulfanylphenyl)-octane-1,2-dione-2-oxime-O-benzoate, 1-(4-phenyl sulfanylphenyl)-octane-1-one oxime-O-acetate, 1-(4-phenyl sulfanylphenyl)-butan-1-one-2-oxime-O-acetate, 2-(O-benzoyloxime)-1-[4-(phenylthio) phenyl]-1,2-octanedione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, or a combination thereof.

The acetophenone-based compound may include, for example, 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propan-1-one, 1-(4-isopropylphenyl)-2-hydroxy-2-methyl-propan-1-one, 1-(4-dodecylphenyl)-2-hydroxy-2-methylpropan-1-one, 4-(2-hydroxyethoxy)-phenyl-(2-hydroxy-2-propyl)ketone, 1-hydroxycyclohexyl phenyl ketone and 2-methyl-1-[4-(methylthio)phenyl]-2-morpholino-propan-1-one, or a combination thereof.

The thioxanthone-based compound may include, for example, thioxanthone, 2-chlorothioxanthone, 2-methylthioxanthone, isopropyl thioxanthone, 2,4-diethyl thioxanthone, and 2,4-diiso propyl thioxanthone, or a combination thereof.

The benzophenone-based compound may include, for example, benzophenone, benzoyl benzoic acid, benzoyl benzoic acid methyl ester, 4-phenyl benzophenone, hydroxybenzophenone, 4-benzoyl-4'-methyl diphenyl sulfide and 3,3'-dimethyl-4-methoxy benzophenone, or a combination thereof.

A content of the photopolymerization initiator may be in a range of about 1 to about 5 parts by weight based on 100 parts by weight of the total solid content of the photosensitive resin composition. The photosensitive resin composition may be sufficiently photopolymerized during exposure.

The ultraviolet absorber may have excellent properties of absorbing a specific wavelength (e.g., ultraviolet light) used for exposure of the photosensitive resin composition. Therefore, the ultraviolet absorber may suppress generation of polymer radicals. Accordingly, the ultraviolet absorber has effects such as preventing discoloration, swelling, separation, and loss of gloss of the composition.

The ultraviolet absorber may use, but is not limited to, a triazine-based compound, a benzotriazole-based compound, a benzophenon-based compound, an oxalanilide-based compound, or a combination thereof. The ultraviolet absorber may be, for example, the following compound.

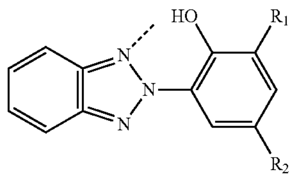

A content of the ultraviolet absorber may be in a range of about 0.1 to about 10 parts by weight based on 100 parts by weight of the total solid content of the photosensitive resin composition. It may be possible to adjust the sensitivity of the photopolymerization initiator by controlling an exposure energy during exposure of the composition and controlling light scattering of the scattering particles. The ultraviolet absorber may be included with the photopolymerization initiator. In an embodiment, a content ratio of the ultraviolet absorber may be in a range of about 40% to about 60% with respect to a content of the photopolymerization initiator. It may be possible to prevent the formation of a residual film of a pattern formed by the composition and ensure pattern stability. In an embodiment, a content ratio of the ultraviolet absorber may be about 50% with respect to a content of the photopolymerization initiator.

The solvent may be a material having compatibility with the photopolymerizable monomer, the photopolymerization initiator, the ultraviolet absorber, the scattering particles, and the binder, but not reacting with them.

The solvent may be, for example, a compound of alcohols such as methanol and ethanol; ethers such as dichloroethyl ether, n-butyl ether, diisoamyl ether, methylphenyl ether and tetrahydrofuran; glycol ethers such as ethylene glycol methyl ether, ethylene glycol ethyl ether and propylene glycol methyl ether; cellosolve acetates such as methyl cellosolve acetate, ethyl cellosolve acetate and diethyl cellosolve acetate; carbitols such as methylethyl carbitol, diethyl carbitol, diethylene glycol monomethyl ether, diethylene glycol monoethyl ether, diethylene glycol dimethyl ether, diethylene glycol methyl ethyl ether and diethylene glycol diethyl ether; propylene glycol alkyl ether acetates such as propylene glycol methyl ether acetate, propylene glycol monoethyl ether acetate and propylene glycol propyl ether acetate; aromatic hydrocarbons such as toluene and xylene; ketones such as methyl ethyl ketone, cyclohexanone, 4-hydroxy-4-methyl-2-pentanone, methyl-n-propyl ketone, methyl-n-butyl ketone, methyl-n-amyl ketone and 2-heptanone; saturated aliphatic monocarboxylic acid alkyl esters such as ethyl acetate, n-butyl acetate and isobutyl acetate; lactic acid alkyl esters such as methyl lactate and ethyl lactate; hydroxyacetic acid alkyl esters such as methyl hydroxyacetate, ethyl hydroxyacetate and butyl hydroxyacetate; acetic acid alkoxyalkyl esters such as methoxymethyl acetate, methoxyethyl acetate, methoxybutyl acetate, ethoxymethyl acetate and ethoxyethyl acetate; 3-hydroxypropionic acid alkyl esters such as methyl 3-hydroxypropionate and ethyl 3-hydroxypropionate; 3-alkoxypropionic acid alkyl esters such as methyl 3-methoxypropionate, ethyl 3-methoxypropionate, ethyl 3-ethoxypropionate and methyl 3-ethoxypropionate; 2-hydroxypropionic acid alkyl esters such as methyl 2-hydroxypropionate, ethyl 2-hydroxypropionate and propyl 2-hydroxypropionate; 2-alkoxypropionic acid alkyl esters such as methyl 2-methoxypropionate, ethyl 2-methoxypropionate, ethyl 2-ethoxypropionate and methyl 2-ethoxypropionate; 2-hydroxy-2-methylpropionic acid alkyl esters such as methyl 2-hydroxy-2-methylpropionate and ethyl 2-hydroxy-2-methylpropionate; 2-alkoxy-2-methylpropionic acid alkyl esters such as methyl 2-methoxy-2-methylpropionate and ethyl 2-ethoxy-2-methylpropionate; esters such as 2-hydroxyethyl propionate, 2-hydroxy-2-methylethyl propionate, hydroxyethyl acetate and methyl 2-hydroxy-3-methylbutanoate; or ketonic acid esters such as ethyl pyruvate. The solvent may include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetylacetone, isophorone, caproic acid, caprylic acid, 1-octanol, 1-nonanol, benzyl alcohol, benzyl acetate, benzoic acid ethyl, diethyl oxalate, diethyl maleate, γ-butyrolactone, ethylene carbonate, propylene carbonate, phenyl cellosolve acetate, or a combination thereof.

In another embodiment, the solvent may include glycol ethers such as ethylene glycol monoethyl ether; ethylene glycol alkyl ether acetates such as ethyl cellosolve acetate; esters such as 2-hydroxyethyl propionate; diethylene glycols such as diethylene glycol monomethyl ether; propylene glycol alkyl ether acetates such as propylene glycol monomethyl ether acetate and propylene glycol propyl ether acetate, or a combination thereof.

A content of the solvent may be in a range of about 70 to about 80 parts by weight based on 100 parts by weight of the photosensitive resin composition. Since the photosensitive resin composition has appropriate viscosity, processability may be excellent.

The scattering particles may be light scattering particles capable of refracting or reflecting light. The scattering particles may include inorganic particles, organic resin particles, or a composite of organic particles and inorganic particles. The scattering particles may include inorganic particles having different particle diameters. In an embodiment, the particle diameter of the scattering particles may be 100 to 300 nm. The light scattering effect of the scatting particles may be excellent, thus increasing light conversion efficiency in a wavelength control layer.

The scattering particles may include inorganic oxide particles, organic particles, or a combination thereof. The scattering particles may include, for example, $BiFeO_3$, $Fe_2O_3$, $WO_3$, $TiO_2$, SiC, $BaTiO_3$, ZnO, $ZrO_2$, ZrO, $Ta_2O_5$, $MoO_3$, $TeO_2$, $Nb_2O_5$, $Fe_3O_4$, $V_2O_5$, $Cu_2O$, BP, $Al_2O_3$, $In_2O_3$, $SnO_2$, $Sb_2O_3$, ITO, or any combination thereof. In an embodiment, the scattering particles may include $TiO_2$.

The content of the scattering particles may be in a range of about 1 to about 30 parts by weight based on 100 parts by weight of the total solid content of the photosensitive resin composition. The light scattering effect of the scattering particles may be excellent, thus increasing the light conversion efficiency in the wavelength control layer.

The photosensitive resin composition according to the embodiment may be formed into the above-described upper bank layer UBN of FIG. 7. As described above, the photosensitive resin composition may increase the photocuring rate of the upper bank layer UBN and, even if uncured residues may be ejected onto the fourth insulating layer PAS4, may render the surface of the fourth insulating layer PAS4 hydrophilic. Therefore, the spreadability of ink applied to the surface of the fourth insulating layer PAS4 may be improved.

Hereinafter, embodiments will be described in more detail by way of Preparation Examples and Experimental Examples of the photosensitive resin composition according to the above-described embodiment.

Preparation Example 1: Preparation of a Photosensitive Resin Composition

Based on 100 parts by weight of the solid content, 40 parts by weight of a photopolymerizable monomer (DPHA), 50 parts by weight of a binder, 2 parts by weight of a photopolymerization initiator (Irgacure 369), 10 parts by weight of scattering particles ($TiO_2$), and 1 part by weight of an ultraviolet absorber were prepared. A photosensitive resin composition was prepared by mixing the solid and the scattering particles in 60 parts by weight of a solvent based on 100 parts by weight of the photosensitive resin composition.

Here, composition sample #1 and sample #2 were prepared by varying the content ratio of repeating units constituting the binder as shown in Table 1 below.

TABLE 1

| | $1^{st}$ repeating unit (%) | $2^{nd}$ repeating unit (%) | $3^{rd}$ repeating unit (%) | $4^{th}$ repeating unit (%) | $5^{th}$ repeating unit (%) |
|---|---|---|---|---|---|
| Sample #1 | 25 | 15 | 36 | 12 | 12 |
| Sample #2 | 35 | 25 | 15 | 10 | 15 |

Experimental Example 1: Evaluation of the Spreadability of Ink on a Silicon Oxide Thin Film Exposed by an Opening of a Bank According to Binder Composition A silicon oxide ($SiO_2$) thin film was deposited on a glass substrate, and a photosensitive resin composition was applied. Pre-baking, exposure, development, and post-baking were performed to form bank patterns having openings exposing the silicon oxide thin film. Here, as for the photosensitive resin composition, substrate sample #1 was prepared by using composition sample #1 prepared in Preparation Example 1 described above, and substrate sample #2 was prepared by using composition sample #2.

Figure 8:
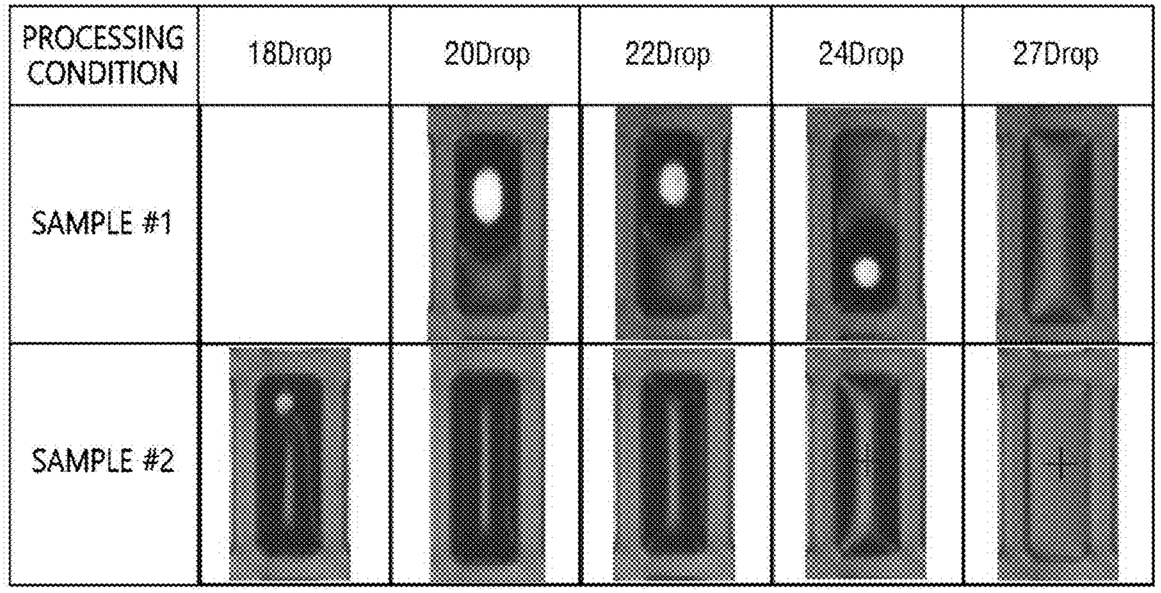
FIG. 8 is a chart showing images obtained by dropping ink into openings of substrate samples #1 and #2 and measuring the ink dropped into the openings using an optical camera.

After ink was dropped into openings of the prepared substrate samples #1 and #2, the ink dropped into the openings was measured using an optical camera and are shown in FIG. 8. Here, the amount of ink dropped was changed to 18, 20, 22, 24, and 27 drops. FIG. 8 is a chart showing images obtained by dropping ink into the openings of substrate samples #1 and #2 and measuring the ink dropped into the openings using the optical camera.

Referring to FIG. 8, in substrate sample #1, an area to which the ink was not applied (a bright area) was observed in the opening in the case of 20, 22 and 24 drops, and the ink did not spread to a uniform thickness in the opening in the case of 27 drops.

On the other hand, in substrate sample #2, an area to which the ink was not applied was not observed in the case of 20, 22 and 24 drops, and the ink spread to a uniform thickness in the opening in the case of 27 drops.

Through this, it was confirmed that the spreadability of the ink dropped onto the surface of the silicon oxide thin film exposed by an opening of a bank was excellent as the content ratio of the first repeating unit, the second repeating unit, and the fifth repeating unit in the binder increased.

Preparation Example 2: Preparation of a Photosensitive Resin Composition

Composition samples #3 through #7 were prepared by varying the content ratio of the photopolymerization initiator and the ultraviolet absorber in the above composition sample #2 as shown in Table 2 below.

TABLE 2

| | #3 | #4 | #5 | #6 | #7 |
|---|---|---|---|---|---|
| Photopolymerization initiator (wt %) | 100 | 100 | 100 | 86 | 71 |
| Ultraviolet absorber (wt %) | 49 | 37 | 23 | 23 | 23 |

Experimental Example 2: Evaluation of the Patternability of a Bank According to the Content Ratio of a Photopolymerization Initiator and an Ultraviolet Absorber A silicon oxide ($SiO_2$) thin film was deposited on a glass substrate, and a photosensitive resin composition was applied. Pre-baking, exposure, development, and post-baking were performed to form bank patterns having openings exposing the silicon oxide thin film. Here, as for the photosensitive resin composition, substrate samples #3 through #7 were prepared by using composition samples #3 through #7 prepared in Preparation Example 2, respectively.

Figure 9:
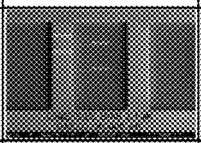
FIG. 9 is a chart showing images of bank patterns of substrate samples #3 through #7.
Figure 9:
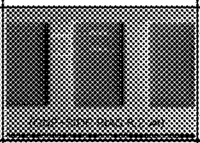
Figure 9:
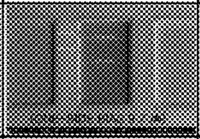
Figure 9:
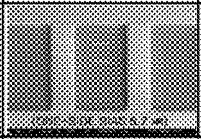
Figure 9:
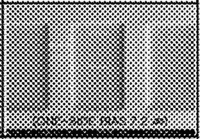
Figure 9:
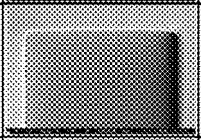
Figure 9:
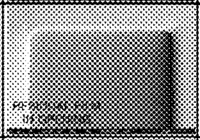
Figure 9:
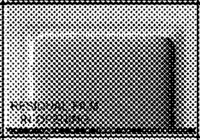
Figure 9:
Figure 9:
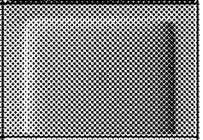
Figure 9:
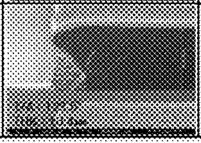
Figure 9:
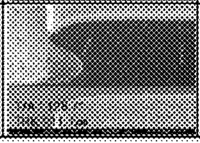
Figure 9:
Figure 9:
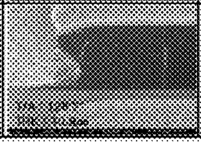
Figure 9:

Images of respective bank patterns of the prepared substrate samples #3 through #7 were obtained using a scanning electron microscope (SEM) and a focused ion beam (FIB) and are shown in FIG. 9. FIG. 9 is a chart showing images of the bank patterns of substrate samples #3 through #7. In FIG. 9, SEM #2 is an enlarged image of SEM #1.

Referring to FIG. 9, substrate samples #3 and #7 had no residual film in an opening and an edge portion of the opening. On the other hand, substrate samples #4 and #5 had a residual film in an opening, and substrate sample #7 had a residual film in an edge portion of an opening.

Through this, it was confirmed that when the content ratio of the ultraviolet absorber was 40 to 60% with respect to the photopolymerization initiator, it was possible to prevent the formation of a residual film of a bank pattern and ensure pattern stability.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A photosensitive resin composition comprising:

a binder;

a photopolymerizable monomer;

a photopolymerization initiator;

an ultraviolet absorber; and a solvent, wherein a content ratio of the ultraviolet absorber is in a range of about 40% to about 60% with respect to a content of the photopolymerization initiator, and the binder comprises:

a first repeating unit represented by Chemical Formula 1;

a second repeating unit represented by Chemical Formula 2;

a third repeating unit comprising one or more repeating units, each independently represented by one of Chemical Formula 3 to Chemical Formula 5;

a fourth repeating unit comprising one or more repeating units, each independently represented by one of Chemical Formula 4 and Chemical Formula 6; and a fifth repeating unit comprising one or more repeating units, each independently represented by one of Chemical Formula 3 to Chemical Formula 8:

[Chemical Formula 1]

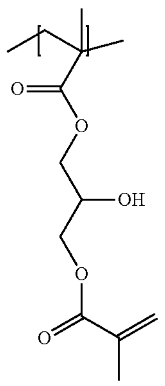

[Chemical Formula 2]

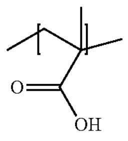

[Chemical Formula 3]

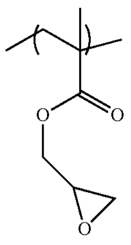

-continued

[Chemical Formula 4]

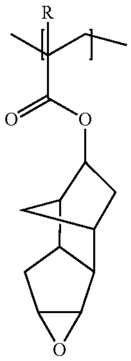

[Chemical Formula 5]

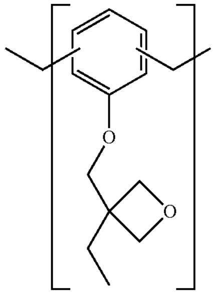

[Chemical Formula 6]

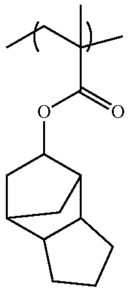

[Chemical Formula 7]

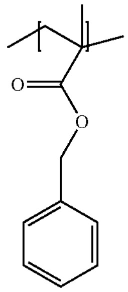

[Chemical Formula 8]

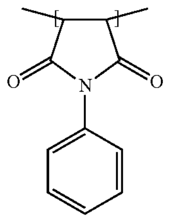

wherein in Chemical Formula 4,

R is a substituted or unsubstituted $C_1$-$C_{10}$ alkyl group, and wherein the third repeating unit, the fourth repeating unit, and the fifth repeating unit are different from each other.

2. The photosensitive resin composition of claim 1, wherein the ultraviolet absorber comprises a triazine-based compound, a benzotriazole-based compound, a benzophenone-based compound, an oxalanilide-based compound, or a combination thereof.

3. The photosensitive resin composition of claim 1, wherein a content of the ultraviolet absorber is in a range of about 0.1 to about 10 parts by weight based on 100 parts by weight of a total solid content of the photosensitive resin composition.

4. The photosensitive resin composition of claim 1, further comprising:

scattering particles, wherein a content of the scattering particles is in a range of about 1 to about 30 parts by weight based on 100 parts by weight of a total solid content of the photosensitive resin composition.

5. The photosensitive resin composition of claim 4, wherein a particle diameter of the scattering particles is in a range of about 100 to about 300 nm.

6. The photosensitive resin composition of claim 1, wherein a content ratio of the first repeating unit to the third repeating unit is in a range of about 2:1 to about 3:1.

7. The photosensitive resin composition of claim 6, wherein a content ratio of the fifth repeating unit to the third repeating unit is in a range of about 1:1 to about 2:1.

8. The photosensitive resin composition of claim 1, wherein based on a total binder content, a content ratio of the first repeating unit is in a range of about 30% to about 40%, a content ratio of the second repeating unit is in a range of about 20% to about 30%, a content ratio of the third repeating unit is in a range of about 10% to 20%, a content ratio of the fourth repeating unit is in a range of about 5% to 15%, and a content ratio of the fifth repeating unit is in a range of about 10% to 20%.

9. The photosensitive resin composition of claim 1, wherein the photopolymerizable monomer comprises ethylene glycol dimethacrylate, diethylene glycol dimethacrylate, triethylene glycol dimethacrylate, propylene glycol dimethacrylate, neopentyl glycol dimethacrylate, 1,4-butanediol dimethacrylate, 1,6-hexanediol dimethacrylate, bisphenol A dimethacrylate, pentaerythritol dimethacrylate, pentaerythritol trimethacrylate, pentaerythritol tetramethacrylate, pentaerythritol hexamethacrylate, dipentaerythritol dimethacrylate, dipentaerythritol trimethacrylate, dipentaerythritol pentamethacrylate, dipentaerythritol hexamethacrylate, bisphenol A epoxy methacrylate, ethylene glycol monomethylether methacrylate, trimethylol propane trimethacrylate, trismethacryloyloxyethyl phosphate, novolac epoxy methacrylate, or a combination thereof.

10. The photosensitive resin composition of claim 1, wherein the photopolymerization initiator comprises an oxime-based compound, an acetophenone-based compound, a thioxanthone-based compound, a benzophenone-based compound, or a combination thereof.

11. The photosensitive resin composition of claim 1, wherein a content of the photopolymerization initiator is in a range of about 1 to about 5 parts by weight based on 100 parts by weight of a total solid content of the photosensitive resin composition.

12. The photosensitive resin composition of claim 1, wherein the solvent comprises ethylene glycol monoethyl ether, ethyl cellosolve acetate, 2-hydroxyethyl propionate, diethylene glycol monomethyl, propylene glycol monomethyl ether acetate, propylene glycol propyl ether acetate, or a combination thereof.

13. The photosensitive resin composition of claim 1, wherein a content of the solvent is in a range of about 70 to about 80 parts by weight based on 100 parts by weight of the photosensitive resin composition.

14. A display device comprising:

a plurality of light emitting elements disposed on a substrate;

an insulating layer disposed on the light emitting elements; and an upper bank layer disposed on the insulating layer and comprising an opening exposing the insulating layer, wherein the upper bank layer comprises:

a binder;

a photopolymerizable monomer;

a photopolymerization initiator; and an ultraviolet absorber, a content ratio of the ultraviolet absorber is in a range of about 40% to about 60% with respect to a content of the photopolymerization initiator, and the binder comprises:

a first repeating unit represented by Chemical Formula 1;

a second repeating unit represented by Chemical Formula 2;

a third repeating unit comprising one or more repeating units, each independently represented by one of Chemical Formula 3 to Chemical Formula 5;

a fourth repeating unit comprising one or more repeating units, each independently represented by one of Chemical Formula 4 and Chemical Formula 6; and a fifth repeating unit comprising one or more repeating units, each independently represented by one of Chemical Formula 3 to Chemical Formula 8:

[Chemical Formula 1]

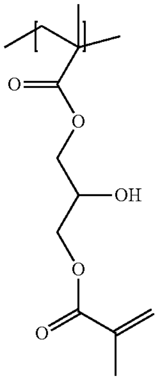

[Chemical Formula 2]

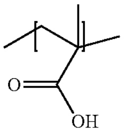

-continued

[Chemical Formula 3]

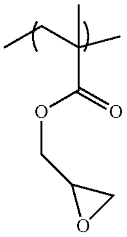

[Chemical Formula 4]

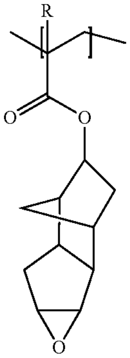

[Chemical Formula 5]

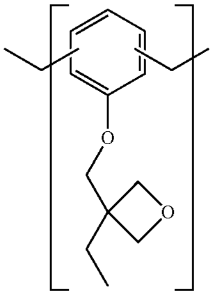

[Chemical Formula 6]

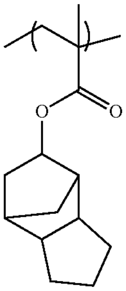

[Chemical Formula 7]

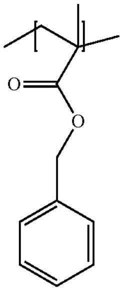

-continued

[Chemical Formula 8]

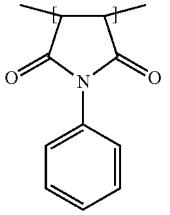

wherein in Chemical Formula 4,

R is a substituted or unsubstituted $C_1$-$C_{10}$ alkyl group, and wherein the third repeating unit, the fourth repeating unit, and the fifth repeating unit are different from each other.

15. The display device of claim 14, wherein the upper bank layer further comprises a plurality of scattering particles, and a particle diameter of the scattering particles is in a range of about 100 to about 300 nm.

16. The display device of claim 14, further comprising:

a color control layer disposed on the insulating layer and disposed in the opening, wherein the color control layer contacts a surface of the insulating layer.

17. The display device of claim 16, further comprising:

at least one capping layer disposed on the color control layer and covering the color control layer and the upper bank layer.

18. The display device of claim 17, further comprising:

a color filter layer disposed on the at least one capping layer.

19. The display device of claim 14, further comprising:

a first electrode and a second electrode disposed under the light emitting elements and spaced apart from each other;

a first connection electrode electrically connected to an end of each light emitting element; and a second connection electrode electrically connected to another end of each light emitting element.

20. The display device of claim 19, wherein each of the light emitting elements comprises:

a first semiconductor layer;

a second semiconductor layer; and a light emitting layer disposed between the first semiconductor layer and the second semiconductor layer.

* * * * *